United States Patent
Chen et al.

(10) Patent No.: US 12,424,299 B2
(45) Date of Patent: Sep. 23, 2025

(54) DIGITAL VERIFY FAILBIT COUNT (VFC) CIRCUIT

(71) Applicant: Yangtze Memory Technologies Co., Ltd., Wuhan (CN)

(72) Inventors: Teng Chen, Wuhan (CN); Xiaojiang Guo, Wuhan (CN); Masao Kuriyama, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 182 days.

(21) Appl. No.: 18/339,280

(22) Filed: Jun. 22, 2023

(65) Prior Publication Data

US 2024/0221859 A1   Jul. 4, 2024

Related U.S. Application Data

(60) Provisional application No. 63/436,223, filed on Dec. 30, 2022.

(51) Int. Cl.
*G11C 29/00* (2006.01)
*G11C 29/52* (2006.01)
*G11C 29/56* (2006.01)

(52) U.S. Cl.
CPC ........ *G11C 29/52* (2013.01); *G11C 29/56016* (2013.01); *G11C 2029/5602* (2013.01)

(58) Field of Classification Search
CPC . G11C 16/0483; G11C 16/3459; G11C 16/10; G11C 11/5628; G11C 16/08; G11C 16/26; G11C 16/14; G11C 16/3431; G11C 16/349; G11C 16/06; G11C 16/102; G11C 16/30; G11C 29/52; G11C 16/16; G11C 16/3436; G11C 16/3445; G11C 2211/5648; G11C 2216/24; G11C 16/24; G11C 16/32; G11C 16/34; G11C 16/344; G11C 2211/5621; G11C 29/44; G11C 29/702; G11C 11/5621; G11C 11/5642; G11C 11/5671; G11C 16/3409; G11C 16/3495; G11C 2029/1208; G11C 2211/5641; G11C 29/021; G11C 29/028; G11C 29/10; G11C 29/12; G11C 29/14; G11C 29/42; G11C 29/808; G11C 11/56; G11C 11/5678; G11C 11/5685; G11C 13/0004; G11C 13/0007; G11C 13/0064; G11C 13/0069; G11C 13/0097; G11C 16/3413; G11C 16/3454; G11C 16/3463; G11C 2013/0073; G11C 2013/0092; G11C 2029/0409; G11C 2029/1204; G11C 2211/5642

See application file for complete search history.

(56) References Cited

U.S. PATENT DOCUMENTS

2019/0051359 A1 *   2/2019   Yoo .................. G11C 16/10

* cited by examiner

Primary Examiner — Thong Q Le
(74) Attorney, Agent, or Firm — Anova Law Group, PLLC

(57) ABSTRACT

A verify failbit count (VFC) circuit includes a counter including a plurality of counter stages coupled one after another and including one or more cache stages in a cache group and a plurality of reception stages divided into a plurality of reception groups each including one or more reception stages of the plurality of reception stages. Each of the reception stages is configured to receive one of a plurality of verification bits generated by a verification operation of a memory device. The counter further includes one or more switches each coupled between two neighboring ones of the plurality of reception groups.

20 Claims, 15 Drawing Sheets

800

| S801: Control a counter of a VFC circuit of a memory device to receive a plurality of verification bits generated by a verification operation of the memory device |

↓

| S803: controlling the counter to count fail bits among the plurality of verification bits to obtain a count result in binary format |

FIG. 8

DIGITAL VERIFY FAILBIT COUNT (VFC) CIRCUIT

CROSS-REFERENCE TO RELATED APPLICATION

This application claims priority to Provisional Application No. 63/436,223, filed Dec. 30, 2022, the entire content of which is incorporated herein by reference.

FIELD OF THE TECHNOLOGY

The present disclosure relates to the field of memory technology and, more particularly, to a digital Verify Failbit Count (VFC) circuit for memory devices.

BACKGROUND OF THE DISCLOSURE

A memory device, such as a three-dimensional (3D) memory device, stores data by storing electric charge, such as electron, in a storage unit, also referred to as a "memory cell." In a memory device, a process of counting memory cells with failed or erroneous data writing is referred to as Verify Failbit Count (VFC). Correspondingly, a circuit that performs the VFC is also referred to as a VFC circuit. The VFC circuit occupies space in the memory device and increases power consumption of the memory device. Further, as existing VFC circuits use analog method to sense failbit numbers, current will be needed during the process. Current can be impacted by several factors, such as power drop, transistor mismatch, and signal routing, which can lead to under count and result in yield loss. Therefore, the VFC circuit needs to be improved.

SUMMARY

In accordance with the disclosure, there is provided a verify failbit count (VFC) circuit including a counter configured to count fail bits among a plurality of verification bits generated by a verification operation of a memory device to obtain a count result in binary format. The counter includes a plurality of counter stages coupled one after another and including one or more cache stages in a cache group and a plurality of reception stages divided into a plurality of reception groups each including one or more reception stages of the plurality of reception stages. Each of the reception stages is configured to receive one of the plurality of verification bits. The counter further includes one or more switches each coupled between two neighboring ones of the plurality of reception groups.

Also in accordance with the disclosure, there is provided a failbit counting method including controlling a counter of a verify failbit count (VFC) circuit of a memory device to receive a plurality of verification bits generated by a verification operation of the memory device, and controlling the counter to count fail bits among the plurality of verification bits to obtain a count result in binary format. The counter includes a plurality of counter stages coupled one after another and including one or more cache stages in a cache group and a plurality of reception stages divided into a plurality of reception groups each including one or more reception stages of the plurality of reception stages. Each of the reception stages is configured to receive one of the plurality of verification bits. The counter further includes one or more switches each coupled between two neighboring ones of the plurality of reception groups.

Also in accordance with the disclosure, there is provided a memory device including a memory cell array including a plurality of memory cells, and a verify failbit count (VFC) circuit coupled to the memory cell array. The VFC circuit includes a counter configured to count fail bits among a plurality of verification bits generated by a verification operation of a memory device to obtain a count result in binary format. The counter includes a plurality of counter stages coupled one after another and including one or more cache stages in a cache group and a plurality of reception stages divided into a plurality of reception groups each including one or more reception stages of the plurality of reception stages. Each of the reception stages is configured to receive one of the plurality of verification bits. The counter further includes one or more switches each coupled between two neighboring ones of the plurality of reception groups.

BRIEF DESCRIPTION OF THE DRAWINGS

FIG. 8 is a flowchart showing an example failbit counting method according to some aspects of the present disclosure.

DESCRIPTION OF EMBODIMENTS

Figure 1A:
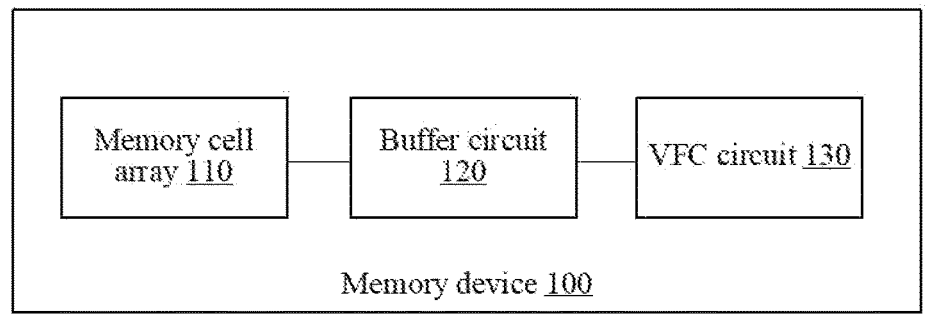
FIG. 1A is a schematic structural diagram of an example memory device according to some aspects of the present disclosure.

The following describes the technical solutions in the embodiments of the present disclosure with reference to the accompanying drawings. Wherever possible, the same reference numbers will be used throughout the drawings to refer to the same or like parts. The described embodiments are merely some but not all of the embodiments of the present disclosure. Other embodiments obtained by a person skilled in the art based on the embodiments of the present disclosure without creative efforts shall fall within the scope of the present disclosure.

References in the specification to "one embodiment," "an embodiment," "an exemplary embodiment," "some embodiments," etc., indicate that the embodiment described may include a particular feature, structure, or characteristic, but not every embodiment necessarily includes the particular feature, structure, or characteristic. Moreover, such phrases do not necessarily refer to the same embodiment.

Further, when a particular feature, structure or characteristic is described in connection with an embodiment, it would be within the knowledge of a person skilled in the art to affect such feature, structure or characteristic in connection with other embodiments whether or not explicitly described. A person of ordinary skill in the art can make modifications to the described embodiments according to the principle of the present disclosure. For example, one or more components of the disclosed device can be omitted or one or more components not explicitly described above can be added to the device. Similarly, one or more steps in the disclosed method can be omitted or one or more steps not explicitly described above can be included in the method.

Unless otherwise defined, all technical and scientific terms used in this disclosure have the same or similar meanings as generally understood by those having ordinary skill in the art. As described herein, the terms used in the specification of the present disclosure are intended to describe example embodiments, instead of limiting the present disclosure. In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," may be understood to convey a singular usage or to convey a plural usage, depending at least in part upon context.

As used herein, when a first component is referred to as "connected" or "coupled" to a second component, it is intended that the first component may be directly connected or coupled to the second component or may be indirectly connected or coupled to the second component via a third component between them.

In this disclosure, a value or a range of values may refer to a desired, target, or nominal value or range of values and can include slight variations. The term "about" or "approximately" associated with a value can allow a variation within, for example, 10% of the value, such as ±2%, ±5%, or ±10% of the value, or another proper variation as appreciated by those having ordinary skill in the art. The term "about" or "approximately" associated with a state can allow a slight deviation from the state.

Further, terms such as "first" and "second" are used to distinguish similar features and do not necessarily require or connote a specific sequence or order.

FIG. 1A is a schematic structural diagram of an example memory device 100 according to some aspects of the present disclosure. As shown in FIG. 1, the memory device 100 includes a memory cell array 110, a buffer circuit 120 coupled to the memory cell array 110, and a verify failbit count (VFC) circuit 130 coupled to the buffer circuit 120.

The memory cell array 110 includes a plurality of memory cells, and the memory cells can be, e.g., Not-AND (NAND) memory cells, Not-OR (NOR) memory cells, and/or memory cells of other types. The memory cells of the memory array 110 can be arranged in a two-dimensional (2D) array and/or in a three-dimensional (3D) array.

For example, the memory array 110 can be a 3D memory array, and the memory cells of the 3D memory array can be configured in rows and columns. Memory cells of a row can be coupled together by a conductive layer (e.g., a metal layer) of the 3D memory array. For example, the control gate of each memory cell of a row can be coupled to the conductive layer. The conductive layer can be coupled to an access line (e.g., a word line). Memory cells of a column can be coupled in series. For example, a drain of a memory cell can be coupled to a source of an adjacent memory cell in a column. Hence, the memory cells of a column can form a string, and such a string is also referred to as a "memory string." Each column of the 3D memory array can be selectively coupled to a data line (e.g., a bit line). Memory cells of the 3D memory array can be written (or programmed) to one of two or more data states by write operations.

Logically, the memory cells of the memory cell array 110 can be arranged in memory targets, planes, blocks, and/or pages in some implementations. For example, the memory array 110 can include one or more memory targets logically. In some implementations, a memory target can contain one or more planes. A plane can contain one or more blocks. A block can contain a plurality of pages. A page, storing a number of bytes or words, can contain one or more rows of memory cells and can be the smallest addressable unit for read and write operations. In some other implementations, a memory target can contain one or more logical units (LUNs). A LUN can contain one or more planes. In such cases, an LUN can be the minimum unit that can execute commands and report status independently. During read and write operations, data can be read from or written to the memory array 110 in pages. During erase operations, data can be erased in blocks, i.e., memory cells in a block can be reset together by a block erase operation.

As noted above, the memory cells of the memory cell array 110 can be divided (not necessarily physically divided) into one or more sections (memory sections), such as pages. Correspondingly, the buffer circuit 120 can include a plurality of buffers each coupled to one of the one or more sections of memory cells. For example, the memory cells in a memory string can be coupled to a bit line, and a buffer of the buffer circuit 120 can be coupled to the memory cells in the memory string via the bit line. As another example, the buffers in the buffer circuit 120 can be page buffers each coupled to the memory cells corresponding to one page of the memory cell array 110. The buffers in the buffer circuit 120 can be configured to read and program (write) data from and to the memory cell array 110 according to the control signals from, e.g., the control logic 140. In one example, the buffers in the buffer circuit 120 can store program data (write data) to be programmed into the memory cell array 110. In another example, the buffers in the buffer circuit 120 can sense the signals (e.g., current) from connection lines coupling the buffers to the sections of the memory cell array 110 to verify whether the data has been properly programmed into target memory cells coupled to select word lines. In still another example, the buffers in the buffer circuit 120 can also sense the low power signals (e.g., current) from connection lines that represents data bits stored in the memory cells and amplify the small voltage swing to recognizable logic levels in a read operation.

Figure 1B:
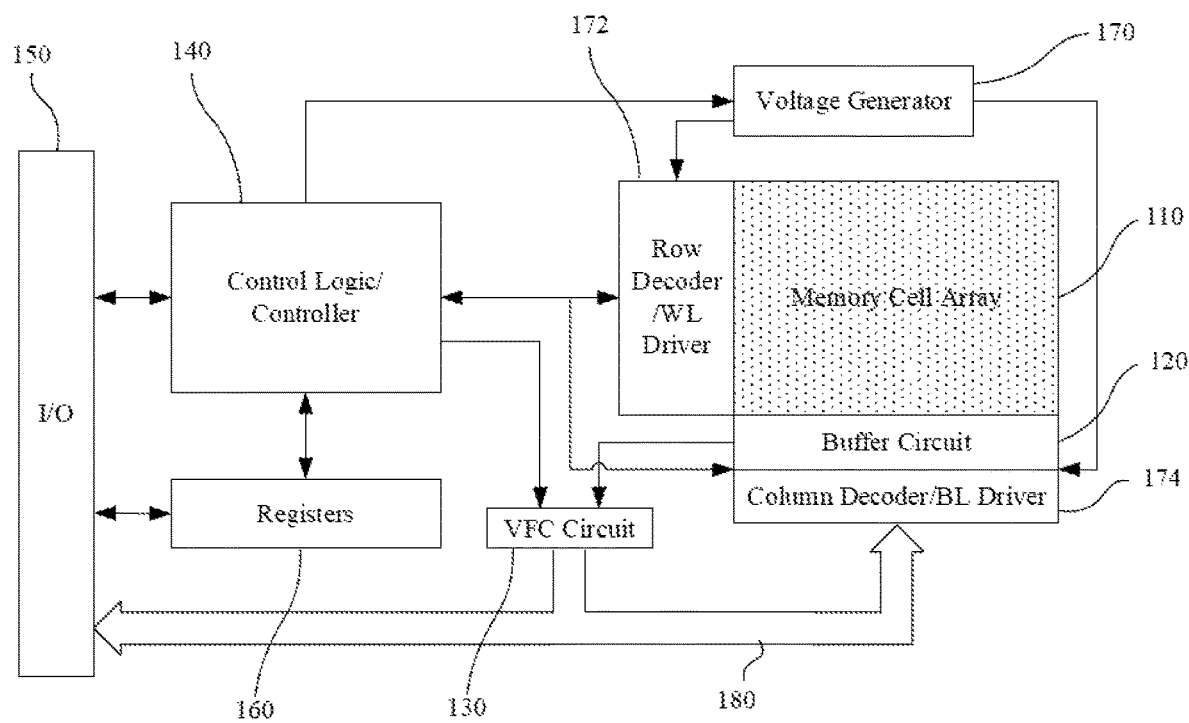
FIG. 1B is another schematic structural diagram of the example memory device according to some aspects of the present disclosure.

FIG. 1B is another schematic structural diagram of the memory device 100 according to some aspects of the present disclosure. As shown in FIG. 1B, the memory device 100 further includes a control logic 140, an input/output (I/O) interface 150, one or more registers 160, a voltage generator 170, a row decoder 172 (word line (WL) driver), and a column decoder 174 (bit line (BL) driver). The memory device 100 also includes a bus 180 coupling various components of the memory device 100, e.g., the buffer circuit 120, the VFC circuit 130, and the row/column decoders 172/174, to the I/O interface 150.

The control logic 140 can function as a controller of the memory device 100 and implement various functions of the memory device 100. For example, the control logic 140 can perform read operations, write (or programming) operations, and erase operations on the memory cell array 110.

The I/O interface 150, which can also be referred to as an I/O component or I/O connections, can contain an I/O circuit to receive an input of command signals, address signals, and data signals to the memory device 100 and transmit data and status information from the memory device 100 to another device (e.g., a host device/an external memory controller). As shown in FIG. 1B, the I/O interface 150 is coupled to the control logic 140 and can be configured to buffer and relay data/information to and from the control logic. For example, when there exists an external controller (e.g., memory controller 1106, 1204, or processor 1413 described below), the I/O interface 150 can act as a control buffer to buffer and relay control commands (e.g., program command) received from the external controller to the control logic 140 and status information received from the control logic 140 to the external controller. The I/O interface 150 is also coupled to the column decoder 174 and can act as a data I/O interface and a data buffer to buffer and relay the data to and from the memory cell array 110. As shown in FIG. 1B, the I/O interface 150 is also coupled to the one or more registers 160.

The one or more registers 160 can include, e.g., a command/address register and/or a status register. The command/address register can latch or temporarily store command signals and address signals and pass the command and address signals to the control logic 140, the row decoder 172, and the column decoder 174. The status register can latch status information. For example, the status register can store status information related to read operation, write operation, and/or erase operation that will be performed or is being performed. The status register can also store status information that will be transmitted to another device (e.g., a host device) via the I/O interface 150. In some implementations, the control logic 140 can include the status register, i.e., the status register can be a part of the control logic 140.

The row decoder 172 and the column decoder 174 can decode row and column address signals, respectively, for accessing the memory cell array 110. The row decoder 172 and column decoder 174 can receive different voltages from the voltage generator 170 and transfer the received voltages to selected items, such as a word line or a bit line of the memory cell array 110. For example, the row decoder 172 can be coupled to the memory cell array 110 via word lines, and can select word lines based on row addresses. The row decoder 172 can be configured to be controlled according to the control signals by the control logic 140 and select/unselect blocks of the memory cell array 110 and select/unselect word lines of a block. The row decoder 172 can be further configured to drive word lines using word line voltages generated from the voltage generator 170. On the other hand, the column decoder 174 can be configured to be controlled by the control logic 140 and select one or more memory strings by applying bit line voltages generated from the voltage generator 170.

The voltage generator 170 can be configured to be controlled by the control logic 140 and generate various voltages required for the operation of the memory device 100, such as word line voltages, select/unselect voltages, bit line voltages, and source line voltages to be supplied to the memory cell array 110. In some implementations, the voltage generator 170 can generate voltages and supply to the buffer circuit 120, the row decoder 172, and the column decoder 174.

Further, the I/O interface 150 can detect command signals, address signals, and data signals from the input. In some implementations, the I/O interface 150 can transmit command and address signals to the command/address register, and transmit data signals to the buffer circuit 120. The I/O interface 150 can also receive data signals from the buffer circuit 120 after the data signals are read from the memory cell array 110 and then transmit the data signals to another device (e.g., a host device/external memory controller). In some cases, the control logic 140 can transmit the command, address, and data signals to the one or more registers 160 and the buffer circuit 120 by sending instructions to the I/O interface 150.

According to some aspects of the present disclosure, after a verification operation on the memory cell array 110 is performed, the buffer circuit 120 can store the verification results and pass the results to the VFC circuit 130. Each buffer (such as a page buffer) outputs a signal to the VFC circuit 130 to indicate whether a memory cell corresponding to the buffer has write failure or error. If a memory cell of the memory cell array 110 passes the verification operation, the signal output by the corresponding buffer to the VFC 120 can be, e.g., 0. In contrast, if a memory cell fails the verification operation, the signal output by the corresponding buffer to the VFC 120 can be, e.g., 1. By processing the signals from the buffer circuit 120, the VFC circuit 130 can obtain a count of memory cells that fail the verification operation and output the count. For example, the VFC circuit 130 can output the count to the I/O interface 150 via the bus 180. Further, the control logic 140 can also send control commands to the VFC circuit 130 to control the operation of the VFC circuit 130.

In some implementations, the VFC circuit is a digital VFC circuit, which can take binary signals from a buffer circuit that indicate verification results of the memory cells, and digitally accumulate them to obtain a total count of failures in the memory cells during the verification operation. Because the accuracy of the digital VFC circuit is not affected by power drop (decreasing of power supply voltage), transistor mismatch, and signal routing discrepancy, etc., the VFC circuit according to some aspects of the present disclosure can count the failures in a memory cell array (number of fail bits) with a high accuracy. An accurate count of the failures in the memory cell array increases the yield. Example VFC circuits according to some aspects of the present disclosure will be described in more detail below. Each of the example VFC circuit can be used as the VFC circuit 130 in FIGS. 1A and 1, or be used as part of the VFC circuit 130 in FIGS. 1A and 1B.

Figure 2:
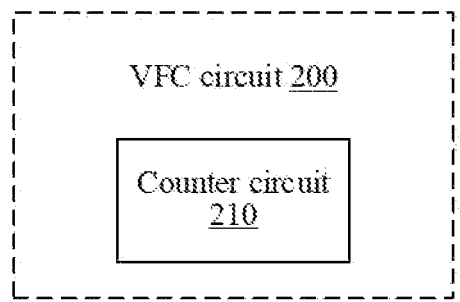
FIG. 2 is a block diagram of an example verify failbit count (VFC) circuit according to some aspects of the present disclosure.

FIG. 2 is a block diagram of an example VFC circuit 200 according to some aspects of the present disclosure. As shown in FIG. 2, the VFC circuit 200 includes a counter circuit 210. The counter circuit 210 can be coupled to a buffer circuit, such as the buffer circuit 120, that stores (buffers/latches) verification results. According to some aspects of the present disclosure, the counter circuit 210 can be a digital counter circuit, i.e., a counter circuit that counts logic 1's from the buffer circuit, rather than relying on currents associated with the buffer circuit to determine whether a bit is pass or fail. In some implementations, the counter circuit 210 includes one or more counters each coupled to one or more buffers, such as page buffers, of the buffer circuit. Each of the one or more counters can be, e.g., a 4-bit counter, an 8-bit counter, or a counter counting more than 8 bits.

According to some aspects of the present disclosure, each counter can receive the verification results (e.g., with 0 representing pass bit and 1 representing fail bit) from the one or more buffers coupled to the counter, perform an algorithm (described in more detail below) to process the verification results, and output the count result in binary format (i.e., output a binary code as the count result).

Figure 3:
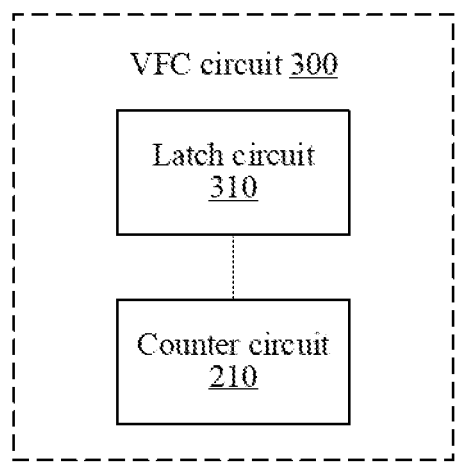
FIG. 3 is a block diagram of another example VFC circuit according to some aspects of the present disclosure.

In some implementations, the counter circuit 210 of the VFC circuit is coupled to the buffer circuit directly and takes the verification results directly from the buffers in the buffer circuit. In some other implementations, the VFC circuit can further include a latch circuit coupled between the counter circuit and the buffer circuit. FIG. 3 is a block diagram of another example VFC circuit 300 according to some aspects of the present disclosure. As shown in FIG. 3, the VFC circuit 300 includes the counter circuit 210, the transcoder circuit 220, and a latch circuit 310 coupled to the counter circuit 210. The latch circuit 310 can include one or more latches each corresponding to and coupled to one buffer (such as one page buffer) in the buffer circuit, and configured to latch the verification result in the corresponding buffer. With the latch circuit 310 being added to the VFC circuit, the buffers in the buffer circuit can transfer the verification results from a verification operation to the latches in the latch circuit 310, and be released and get ready for the next round of verification operation. Therefore, the buffers do not have to wait until the VFC circuit finishes counting then be released to get ready for buffering further verification results. Accordingly, the efficiency of the entire device can be improved.

Figure 4:
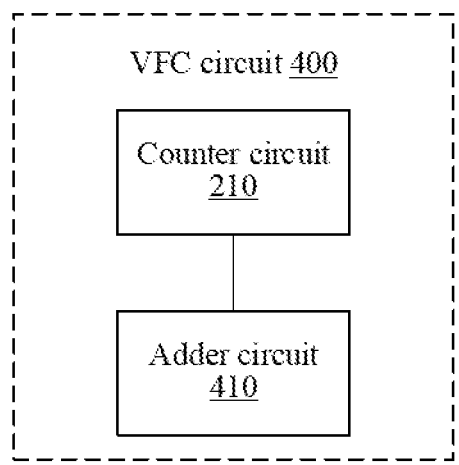
FIG. 4 is a block diagram of another example VFC circuit according to some aspects of the present disclosure.

FIG. 4 is a block diagram of another example VFC circuit 400 according to some aspects of the present disclosure. As shown in FIG. 4, the VFC circuit 400 includes the counter circuit 210 and an adder circuit 410. In the example shown in FIG. 4, the counter circuit 210 includes a plurality of counters. The adder circuit 410 includes one or more adders and is configured to sum up the outputs from the plurality of counters. The number of adders in and the configuration of the adder circuit 410 can depend on, e.g., the number of the counters. For example, the adder circuit 410 can include one adder configured to add outputs from two counters. As another example, the adder circuit 410 can include a plurality of adders configured in a multi-level configuration, i.e., arranged in a plurality of levels. Each adder in the first level of the multi-level configuration can be configured to add outputs from two counters. Further, each adder in a subsequent level of the multi-level configuration can be configured to add outputs from two adders in a previous level, or to add the output from one adder in a previous level and the output from one counter. For example, the counter circuit 210 includes four counters and the adder circuit 410 can include three adders, with two adders in the first level each configured to add outputs from two counters and one adder in the second level configured to add outputs from the two adders in the first level. As another example, the counter circuit 210 includes three counters and the adder circuit 410 can include two adders, with one adder in the first level configured to add outputs from two counters and one adder in the second level configured to add the output from the adder in the first level and the output from the third counter.

Specifically, in the example where the counter circuit 210 includes four counters and the adder circuit 410 includes three adders with two adders in the first level and one adder in the second level, after one verification operation, each counter can count the fail bits from corresponding buffers and output a binary code. Each adder in the first level can add the binary codes from two counters coupled thereto to obtain a binary sum (an intermediate sum) of the two binary codes. The adder in the second level can add the binary sums (intermediate sums) from the two adders in the first level to obtain a larger binary sum. The adder circuit 410 can output the larger binary sum (sum result) as the failbit count of corresponding part of the memory cell array during this verification operation.

Figure 5:
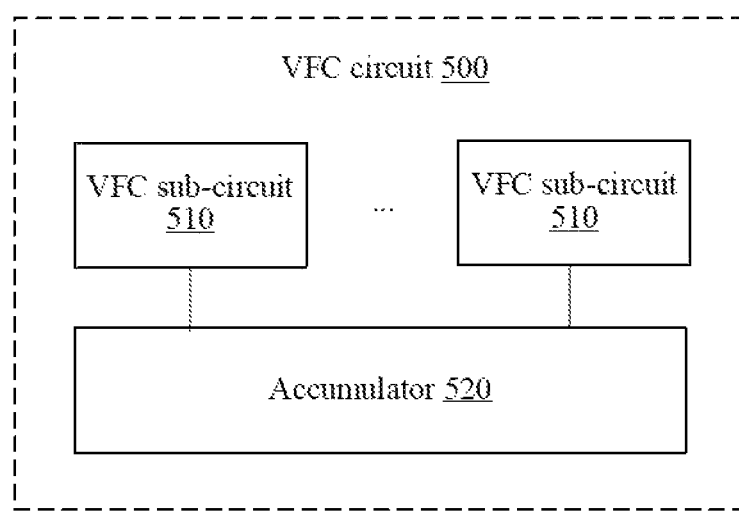
FIG. 5 is a block diagram of another example VFC circuit according to some aspects of the present disclosure.

FIG. 5 is a block diagram of another example VFC circuit 500 according to some aspects of the present disclosure. As shown in FIG. 5, the VFC circuit 500 includes a plurality of VFC sub-circuits 510 coupled to an accumulator 520. Each VFC sub-circuit 510 can, e.g., have a structure same as or similar to the VFC circuit 200 shown in FIG. 2, the VFC circuit 300 shown in FIG. 3, or the VFC circuit 400 shown in FIG. 4. The accumulator 520 is configured to accumulate the final binary sums output from the plurality of VFC sub-circuits 510, each of which can be obtained by, e.g., the adder circuit 410 of the corresponding VFC sub-circuit 510 as described above. By accumulating the final binary sums from the plurality of VFC sub-circuits 510, the accumulator 520 can obtain the total count of the failures in memory cells during the verification operation. In some implementations, the memory device has one accumulator 520 and hence the one accumulator 520 can output the total count of fail bits of the entire memory device.

Figure 6:
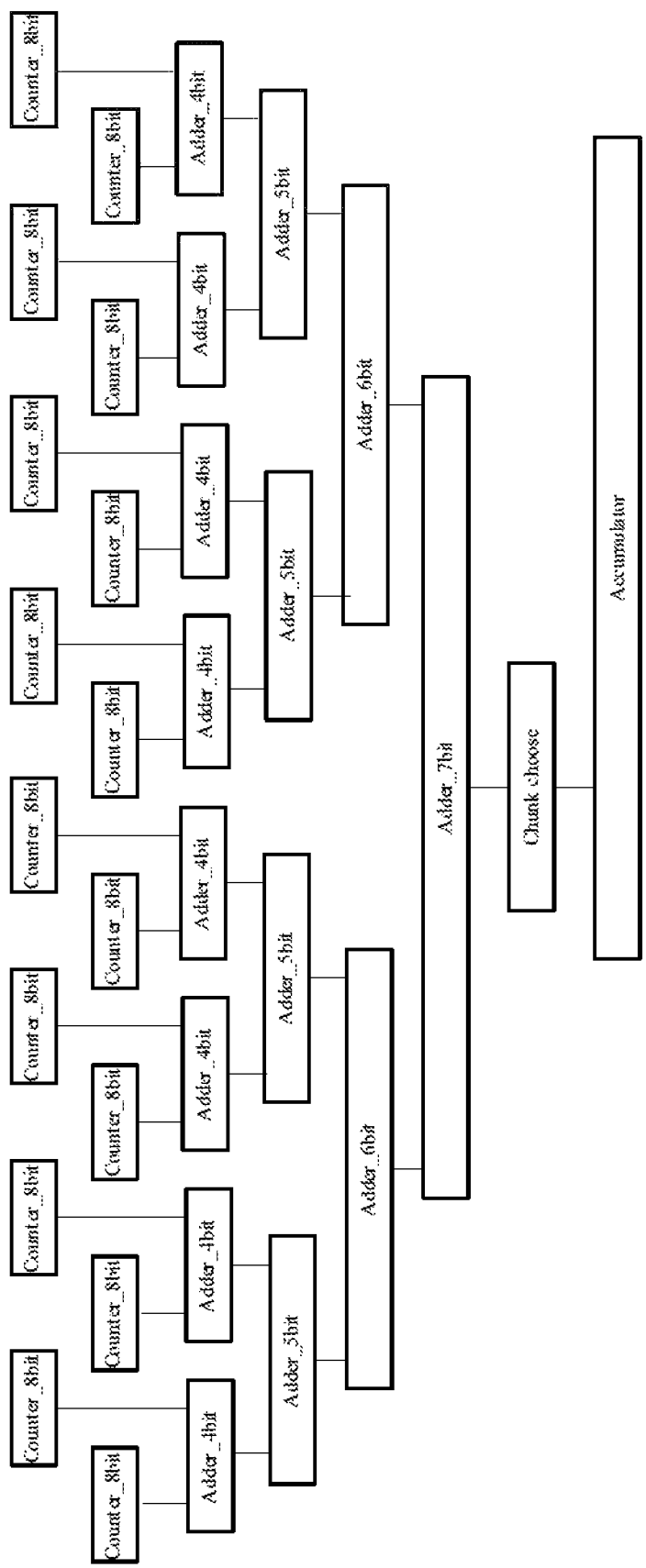
FIG. 6 is a block diagram showing configuration and operation of a portion of another example VFC circuit according to some aspects of the present disclosure.

FIG. 6 is a block diagram showing configuration and operation of a portion of another example VFC circuit according to some aspects of the present disclosure. In the example shown in FIG. 6, the VFC circuit includes sixteen counters, a plurality of adders to add the numbers counted by the sixteen counters to obtain a sum result, and an accumulator to accumulate the sum results. FIG. 6 shows sixteen counters as an example. The number of counters can be determined according to, e.g., a size of the memory cell array and how the memory cell array is divided. The sixteen counters can be considered a counting group. The VFC circuit can include a plurality of counting groups each configured to count fail bits for a different part of the memory cell array and output the count result to the accumulator. In some implementations, multiple counting groups can be further grouped into a larger group. The configuration of the VFC circuit and hierarchy of the counters/groups can be determined according to the structure and scale of the memory cell array. The count results from all counters/groups can eventually be output to the accumulator for the accumulator to obtain a final count result for the entire memory device.

In the example shown in FIG. 6, each counter is an 8-bit counter. In some other embodiments, the counters can be of other types. As shown in FIG. 6, each counter outputs an 8-bit count result to the first level of adders, which are 4-bit adders. The adders in the second level are 5-bit adders each configured to add the 5-bit count results from two corresponding 4-bit adders in the first level, and output a 6-bit count result. Similarly, the adders in the third level are 6-bit adders each coupled to two 5-bit counters in the second level and configured to add the 6-bit count results from the two corresponding 5-bit adders to output a 7-bit count result. In the example shown in FIG. 8, each counting group includes one 7-bit adder in the fourth level, which is coupled to the two 6-bit adders in the third level and configured to add the 7-bit count results from the two 6-bit adders to output an 8-bit count result.

As shown in FIG. 6, the VFC circuit further includes a chunk choose circuit to aggregate the results from the sixteen counters. The VFC circuit accumulates sixteen times in each verification operation.

The number of counters, the number of levels of adders, and the bit number of the counters etc., in FIG. 6 are just examples and for illustrative purposes only. In other implementations, different numbers than those shown in FIG. 6 can be adopted.

Figure 7A:
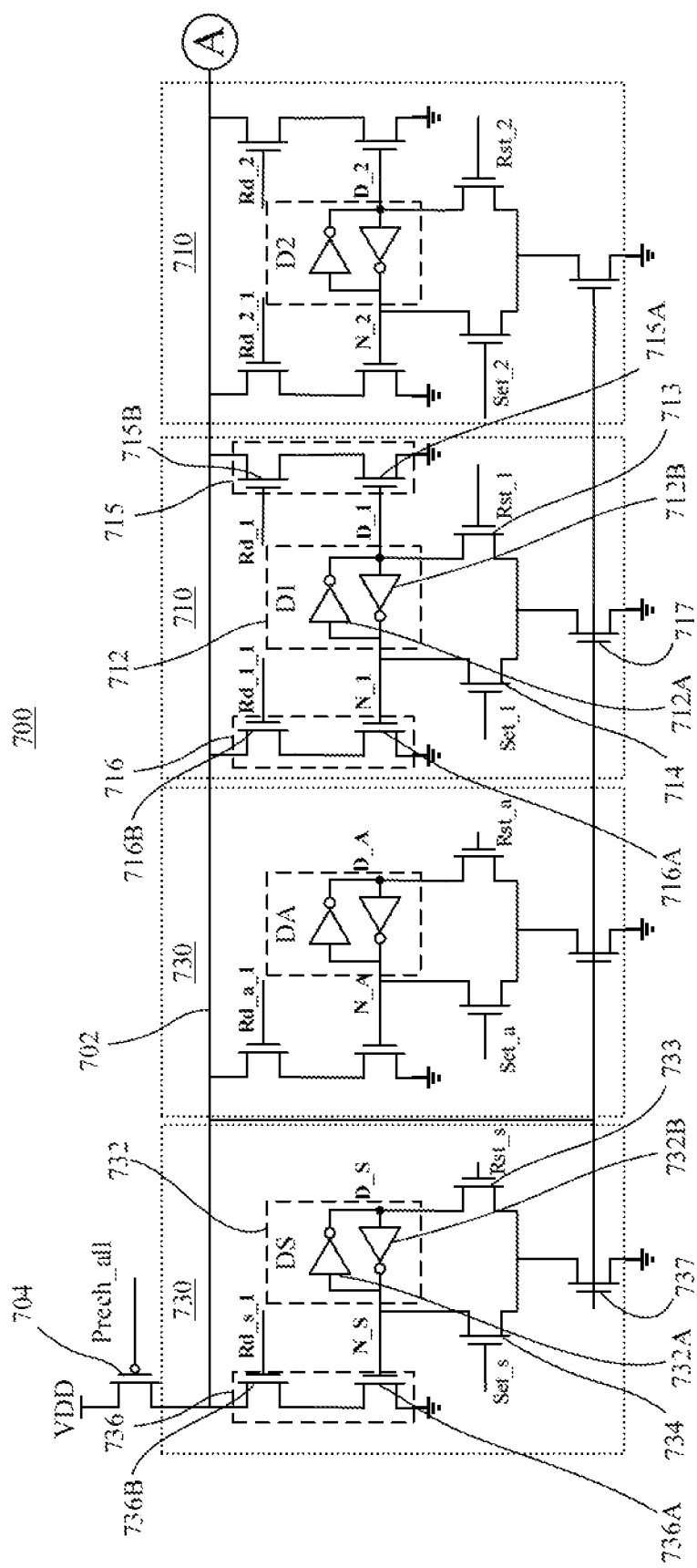
FIGS. 7A-7C are schematic circuit diagrams of an example counter according to some aspects of the disclosure.
Figure 7B:
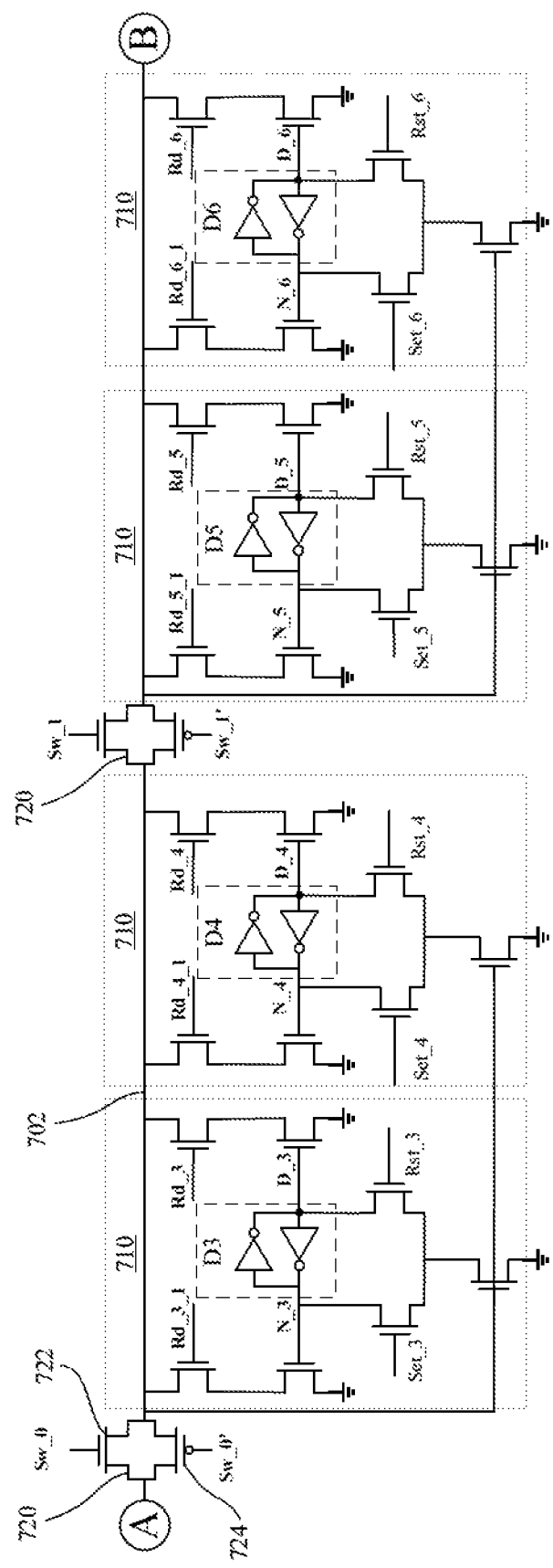
Figure 7C:
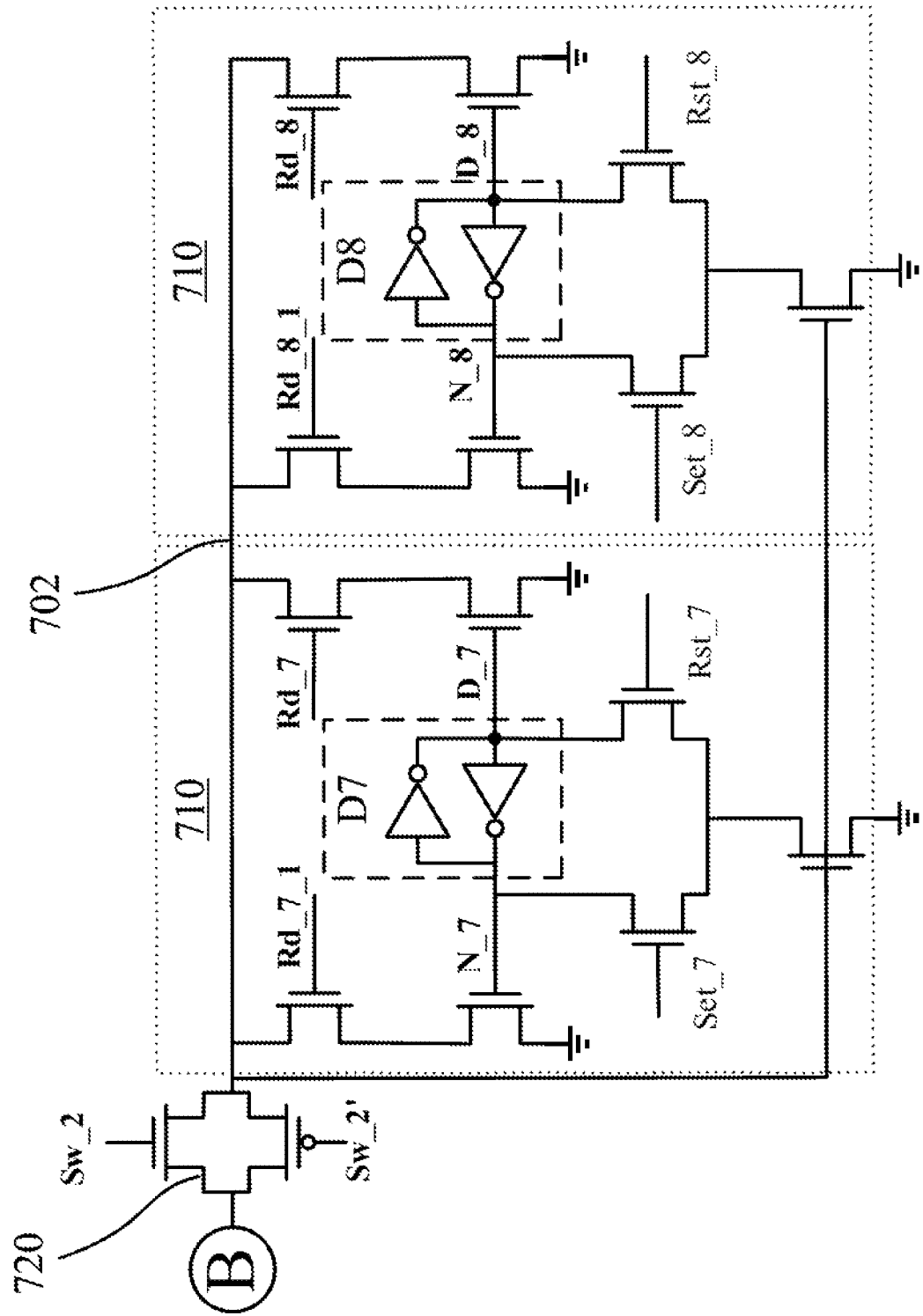

FIGS. 7A-7C are schematic circuit diagrams of an example counter 700 according to some aspects of the disclosure. Specifically, FIGS. 7A-7C show different portions of the counter 700. Circled letters A and B in FIGS. 7A-7C are used for the sole purpose of indicating the connection points of the different portions of the counter 700, but they are not and do not represent parts or components of the counter 700.

The example counter 700 in FIGS. 7A-7C is an 8-bit counter, which is configured to latch eight verification bits, and count fail bits among the eight verification bits to obtain the count result in binary format. As shown in FIGS. 7A-7C, the counter 700 includes a power supply line 702 coupled to a power source (VDD) via a power-supply transistor 704. The power-supply transistor 704 can be, for example, a P-channel transistor, such as a P-channel metal-on-semiconductor (PMOS) transistor. The counter 700 further includes a plurality of counter stages (ten counter stages in the example shown in FIGS. 7A-7C) coupled one after another and between the power supply line 702 and ground. Each of the counter stages includes a counter latch configured to latch a verification result or count result, as described in more detail below.

As shown in FIGS. 7A-7C, the plurality of counter stages include a plurality of reception stages 710 (eight reception stages in the example shown in FIGS. 7A-7C) coupled one after another. Each of the reception stages 710 is configured to receive and latch one of the verification bits. The plurality of reception stages 710 can have a same or similar structures, e.g., same or similar components coupled in a same or similar manner. The structure of one of the reception stages 710 will be described below as example.

As shown in FIGS. 7A-7C, each reception stage 710 includes a counter latch 712 (a counter latch in a reception stage 710 is also referred to as a "reception latch"). The counter latch 712 includes a first inverter 712A and a second inverter 712B. An output of the first inverter 712A is coupled to an input of the second inverter 712B, which together form or are coupled to a first terminal of the counter latch 712 (the terminal of the counter latch 712 on the right in the example depicted in FIGS. 7A-7C). Similarly, an output of the second inverter 712B is coupled to an input of the first inverter 712A, which together form or are coupled to a second terminal of the counter latch 712 (the terminal of the counter latch 712 on the left in the example depicted in FIGS. 7A-7C).

As shown in FIGS. 7A-7C, the reception stage 710 further includes a first transistor 713 (also referred to as a "first data transistor," and the first data transistor 713 in a reception stage 710 is also referred to as a "first reception data transistor") coupled to the first terminal of the counter latch 712 and a second transistor 714 (also referred to as a "second data transistor," and the second data transistor 714 in a reception stage 710 is also referred to as a "second reception data transistor") coupled to the second terminal of the counter latch 712. The first transistor 713 and the second transistor 714 in the reception stage 710 form a transistor pair configured to control the binary digit latched in the counter latch 712.

In the example depicted in FIGS. 7A-7C, the gate of the first transistor 713 (the transistor on the right) is labeled as receiving a reset signal and the gate of the second transistor 714 (the transistor on the left) is labeled as receiving a set signal. Therefore, in this configuration, the first transistor 713 can be considered as a reset transistor for the counter latch 712, and the second transistor 714 can be considered as a set transistor for the counter latch 712. Correspondingly, the first terminal of the counter latch 712 can be considered as an output of the counter latch 712, and the second terminal of the counter latch 712 can be considered as a complementary output of the counter latch 712. That is, in the counter latch 712, the first terminal (right side of the counter latch 712 in FIGS. 7A-7C) is used to store the data latched by the counter latch 712. The counter latch 712 (and hence the reception stage 710) can have a plurality of different storage states, such as a first storage state and a second storage state, that can be used to indicate different data stored in the counter latch 712 (i.e., in the reception stage 710). For the reception stage 710, the different storage states can be used to represent different verification bits, such as the first storage state representing that the reception stage 710 stores a fail bit and the second storage state representing that the reception stage 710 stores a pass bit.

For example, as shown in FIGS. 7A-7C, the first transistor 713 and the second transistor 714 can be N-channel transistors, such as N-channel metal-on-semiconductor (NMOS) transistors. In this scenario, when the second transistor 714 (set transistor) is in a work state (e.g., source/drain thereof is properly grounded), a high voltage level (representing binary 1) applied to the gate of the second transistor 714 will cause the first terminal of the counter latch 712 to be at a high level, i.e., setting the counter latch 712 to store binary 1. Correspondingly, when the first transistor 713 (reset transistor) is in a work state, a high voltage level (representing binary 1) applied to the gate of the first transistor 713 will cause the second terminal of the counter latch 712 to be at a high level and correspondingly the first terminal of the counter latch 712 to be at a low level, i.e., resetting the counter latch 712 to store binary 0.

A binary value can be used to represent fail bit. For example, in this disclosure, binary 1 can be used to represent fail bit and correspondingly binary 0 can be used to represent pass bit. In this disclosure, a latch storing a binary value not representing fail bit (such as binary 0, i.e., low voltage level at the first terminal of the latch) is also referred to as the latch not storing a fail bit; and a latch storing a binary value representing fail (such as binary 1, i.e., high voltage level at the first terminal of the latch) bit is also referred to as the latch storing a fail bit. Correspondingly, writing/storing a binary value representing fail bit into a latch is also referred to as writing/storing a fail bit into the latch.

As shown in FIGS. 7A-7C, the reception stage 710 further includes a first transistor string 715 coupled to the first terminal of the counter latch 712 and a second transistor string 716 coupled to the second terminal of the counter latch 712. Each of the first transistor string 715 and the second transistor string 716 includes a plurality of transistors coupled in series (e.g., transistors 715A and 715B in the first transistor string 715 and transistors 716A and 716B in the second transistor string 716 shown in FIGS. 7A-7C, such transistors are also referred to as "pass transistors" or "string transistors").

As shown in FIGS. 7A-7C, the reception stage 710 further includes a ground transistor 717 configured to couple the first transistor 713 and second transistor 714 to ground.

In some implementations, the first transistor 713, the second transistor 714, the transistors 715A, 715B, 716A, and 716B, and the ground transistor 717 can all be N-channel transistors, such as NMOS transistors.

As shown in FIGS. 7A-7C, a drain electrode of the first transistor 713 is coupled to the output of the first inverter 712A and the input of the second inverter 712B (i.e., the output of the counter latch 712). A drain electrode of the second transistor 714 is coupled to the input of the first inverter 712A and the output of the second inverter 712B (i.e., the complementary output of the counter latch 712). Source electrodes of the first transistor 713 and the second transistor 714 are coupled together, and further coupled to a drain electrode of the ground transistor 717. A source electrode of the ground transistor 717 is coupled to the ground.

Further, as shown in FIGS. 7A-7C, the output of the counter latch 712 is coupled to a gate electrode of the transistor 715A in the first transistor string 715. A drain electrode of the transistor 715A is coupled to a source electrode of the transistor 715B, and a source electrode of the transistor 715A is coupled to the ground. A drain electrode of the transistor 715B is coupled to a drain electrode of the power-supply transistor 704.

Similarly, as shown in FIGS. 7A-7C, the complementary output of the counter latch 712 is coupled to a gate electrode of the transistor 716A in the second transistor string 716. A drain electrode of the transistor 716A is coupled to a source electrode of the transistor 716B, and a source electrode of the transistor 716A is coupled to the ground. A drain electrode of the transistor 716B is coupled to the drain electrode of the power-supply transistor 704.

Further, as shown in FIGS. 7A-7C, a gate electrode of the ground transistor 717 is also coupled to the drain electrode of the power-supply transistor 704.

As noted above, the counter 700 includes a plurality of reception stages 710. The reception stages 710 can have same or similar components coupled in a same or similar manner. The reception stages 710 can be divided into a plurality of reception groups each including one or more of the reception stages 710. The counter 700 further includes one or more switches 720 each coupled between two neighboring ones of the plurality of reception groups. As shown in FIGS. 7A-7C, the switches are connected in the power supply line 702, and each of the switch 720 is coupled between one of the reception stages 710 and the power-supply transistor 704. In this disclosure, if a reception stage or reception group is coupled to the power-supply transistor 704 via a switch 720, then the reception stage or reception group can be referred to as being coupled "after" the switch 720. Similarly, if a reception stage or reception group is coupled between the power supply transistor 704 and a switch 720, then the reception stage or reception group can be referred to as being coupled "before" the switch 720.

By controlling the on/off of a switch 720, the reception stage(s) 710/reception group(s) coupled after the switch 720 can be selectedly controlled to receive power supply from the power-supply transistor 704. Thus, the one or more switches 720 can be configured to control power supply to the plurality of reception groups the reception group coupled before the one or more switches 720, i.e., except for the one reception group coupled to a cache group described below. Further, by controlling the on/off of the one or more switches 720, the different reception groups can be allowed to operate together or independently, and hence data stored in the different reception groups can be processed together or independently.

In the example shown in FIGS. 7A-7C, the counter 700 includes eight reception stages 710 and three switches 720. The three switches 720 separate the eight reception stages 710 into four reception groups each including two reception stages 710. In some other implementations, the counter 700 can include a different number of reception stages 710 and a different number of switches 720 separating the reception stages 710 into a different number of reception groups each including a different number of reception stages 710. In general, the counter 710 can include N reception stages 710 while each reception group can include M reception stages 710, where N and M are integers. In some implementations, N can be an integer that is a power of 2, such as 4, 8, 16, or 32; and M can be an integer that is also a power of 2 but smaller than or equal to N/2, such as 2 or 4. That is, the N reception stages 710 can be divided into N/M reception groups. Correspondingly, the counter 710 can include N/M−1 switches 720 to separate the N/M reception groups.

As shown in FIGS. 7B and 7C, the switch 720 includes a first switch transistor 722 and a second switch transistor 724 coupled to each other. In particular, the first switch transistor 722 is an NMOS transistor and the second switch transistor 724 is a PMOS transistor. Source and drain of the first switch transistor 722 are coupled to drain and source of the second switch transistor 724, respectively. A gate of the first switch transistor 722 is configured to receive a control signal (also referred to as a "switch signal") and a gate of the second switch transistor 724 is configured to receive a complimentary of the control signal (represented using a prime in the figures).

As noted above, the plurality of reception stages 710 are configured to receive the verification bits generated by the verification operation. As will be described in more detail below, control signals can be applied to the counter 700 and control the counter 700 to perform an operation (counting operation) to count the number of fail bits in the verification bits and obtain a count result in binary format. The binary-format count result can be stored in one or more of the plurality of counter stages (in the counter latches thereof). In some implementations, one or more of the reception stages 710 (specifically the counter latches 712 thereof) will also be configured to store (cache) at least part of the binary-format count result. That is, such designated reception stage(s) 710 serves dual purposes in the process (receiving verification bits and storing/caching count result), and can also be referred to as "dual-purpose counter stages." In the example shown in FIGS. 7A-7C, the reception stages 710 in the first reception group, i.e., the reception group directly coupled to the power-supply transistor 704 without via a switch (the reception group shown in FIG. 7A), are dual-purpose counter stages.

In some implementations, in addition to the dual-purpose counter stage(s), one or more of the plurality of counter stages of the counter 700 are also configured to store (cache) the count result but not to receive the verification bits. That is, as shown in FIG. 7A, the plurality of counter stages further include one or more cache stages 730 (two cache stages in the example counter 700 shown in FIGS. 7A-7C) each configured to store (cache) one bit of the binary-format count result. The one or more cache stages 730 are coupled to the first reception group.

As shown in FIG. 7A, the structure of a cache stage 730 is similar to the structure of a reception stage 710, except that the cache stage 730 includes one transistor string instead of two. Specifically, the cache stage 730 includes a counter latch 732 (a counter latch in a cache stage 730 is also referred to as a "cache latch"). The counter latch 732 includes a first inverter 732A and a second inverter 732B. An output of the first inverter 732A is coupled to an input of the second inverter 732B, which together form or are coupled to a first terminal of the counter latch 732 (the terminal of the counter latch 732 on the right in the example depicted in FIG. 7A). Similarly, an output of the second inverter 732B is coupled to an input of the first inverter 732A, which together form or are coupled to a second terminal of the counter latch 732 (the terminal of the counter latch 732 on the left in the example depicted in FIG. 7A).

As shown in FIG. 7A, the cache stage 730 further includes a first transistor 733 (also referred to as a "first data transistor," and the first data transistor 733 in a cache stage 730 is also referred to as a "first cache data transistor") coupled to the first terminal of the counter latch 732 and a second transistor 734 (also referred to as a "second data transistor," and the second data transistor 734 in a cache stage 730 is also referred to as a "second cache data transistor") coupled to the second terminal of the counter latch 732. The first transistor 733 and the second transistor 734 in the cache stage 730 form a transistor pair configured to control the binary digit latched in the counter latch 732.

In the example depicted in FIG. 7A, the gate of the first transistor 733 (the transistor on the right) is labeled as receiving a reset signal and the gate of the second transistor 734 (the transistor on the left) is labeled as receiving a set signal. Therefore, in this configuration, the first transistor 733 can be considered as a reset transistor for the counter latch 732, and the second transistor 734 can be considered as a set transistor for the counter latch 732. Correspondingly, the first terminal of the counter latch 732 can be considered as an output of the counter latch 732, and the second terminal of the counter latch 732 can be considered as a complementary output of the counter latch 732. That is, in the counter latch 732, the first terminal (right side of the counter latch 732 in FIG. 7A is used to store the data latched by the counter latch 732. The counter latch 732 (and hence the cache stage 730) can have a plurality of different storage states, such as a first storage state and a second storage state, that can be used to indicate different data stored in the counter latch 732 (i.e., in the cache stage 730). For the cache stage 730, the different storage states can be used to represent different binary value, such as the first storage state representing that the cache stage 730 stores binary 1 and the second storage state representing that the cache stage 730 stores binary 0. Similarly, when a dual-purpose counter stage is used to store the final count result, the storage states thereof can be designated similarly as those of a cache stage 730.

For example, as shown in FIG. 7A, the first transistor 733 and the second transistor 734 can be N-channel transistors, such as NMOS transistors. In this scenario, when the second transistor 734 (set transistor) is in a work state (e.g., source/drain thereof is properly grounded), a high voltage level (representing binary 1) applied to the gate of the second transistor 734 will cause the first terminal of the counter latch 732 to be at a high level, i.e., setting the counter latch 732 to store binary 1. Correspondingly, when the first transistor 733 (reset transistor) is in a work state, a high voltage level (representing binary 1) applied to the gate of the first transistor 733 will cause the second terminal of the counter latch 732 to be at a high level and correspondingly the first terminal of the counter latch 732 to be at a low level, i.e., resetting the counter latch 732 to store binary 0.

As shown in FIG. 7A, the cache stage 730 further includes a transistor string 736 coupled to the second terminal of the counter latch 732. The transistor string 736 includes a plurality of transistors coupled in series (e.g., transistors 736A and 736B shown in FIG. 7A, such transistors are also referred to as "pass transistors" or "string transistors").

As shown in FIG. 7A, the cache stage 730 further includes a ground transistor 737 configured to couple the first transistor 733 and second transistor 734 to ground.

In some implementations, the first transistor 733, the second transistor 734, the transistors 736A and 736B, and the ground transistor 737 can all be N-channel transistors, such as NMOS transistors.

As shown in FIG. 7A, a drain electrode of the first transistor 733 is coupled to the output of the first inverter 732A and the input of the second inverter 732B (i.e., the output of the counter latch 732). A drain electrode of the second transistor 734 is coupled to the input of the first inverter 732A and the output of the second inverter 732B (i.e., the complementary output of the counter latch 732). Source electrodes of the first transistor 733 and the second transistor 734 are coupled together, and further coupled to a drain electrode of the ground transistor 737. A source electrode of the ground transistor 737 is coupled to the ground.

Further, as shown in FIG. 7A, the complementary output of the counter latch 732 is coupled to a gate electrode of the transistor 736A in the transistor string 736. A drain electrode of the transistor 736A is coupled to a source electrode of the transistor 736B, and a source electrode of the transistor 736A is coupled to the ground. A drain electrode of the transistor 736B is coupled to the drain electrode of the power-supply transistor 704.

Further, as shown in FIG. 7A, a gate electrode of the ground transistor 737 is also coupled to the drain electrode of the power-supply transistor 704.

Consistent with the disclosure, the one or more cache stages 730 (specifically the counter latches 732 thereof) are configured to store (cache) at least part of the binary-format count result. The one or more cache stages 730 and the one or more designated reception stages 710 (dual-purpose counter stages) together store the entire binary-format count result. In the example counter 700 shown in FIGS. 7A-7C, two counter stages are cache stages and two counter stages are designated reception stages (dual-purpose counter stages). These four counter stages together can store a four-digit binary-format count result.

FIG. 8 is a flowchart showing an example failbit counting method 800 according to some aspects of the present disclosure. The method 800 can be applied to a memory device according to some aspects of the present disclosure, such as any of the example memory devices described in the present disclosure (e.g., the memory device 100 shown in FIG. 1A or 1B). In some implementations, the method 800 can be implemented by, e.g., a VFC circuit according to some aspects of the present disclosure, such as any of the example VFC circuits described above, under the control of a processing device, such as any of the control logic 140 described above or the example memory controllers 1106, 1204, and 1304, or the processor 1413 described below. As shown in FIG. 8, the method 800 includes the following processes.

At S801, a counter of a VFC circuit of a memory device is controlled to receive a plurality of verification bits generated by a verification operation of the memory device.

At S803, the counter is controlled to count fail bits among the plurality of verification bits to obtain a count result in binary format.

The counter can be a counter according to some aspects of the present disclosure, such as any of the example counters described above. Specifically, the counter can include a plurality of counter stages coupled one after another. The plurality of counter stages can include two types of counter stages: one or more cache stages in a cache group and a plurality of reception stages divided into a plurality of reception groups. Each reception group can include one or more reception stages. The counter can further include one or more switches each coupled between two neighboring ones of the plurality of reception groups. One of the plurality of reception groups can be directly connected to the cache group without being separated therefrom by a switch. As described above, each of the reception stages can be configured to receive one of the plurality of verification bits, and the one or more cache stages can be configured to store at least part of the binary-format count result. Further, the reception stage(s) in the reception group directly connected to the cache group can also store at least another part of the binary-format count result, and hence serve as dual-purpose counter stage(s).

In some implementations, each of the plurality of counter stages can have a first storage state and a second storage state. The first storage state and the second storage state of a reception stage can be used to represent that the reception stage stores a fail bit and a pass bit, respectively, after the verification bits are received by the counter. On the other hand, the first storage state and the second storage state of a cache stage, or those of a dual-purpose counter stage, can be used to represent a binary digit in the binary-format count result. In some implementations, controlling the counter to count fail bits to obtain the count result in binary format can include determining storage states of the plurality of counter stages, and controlling the storage states of the plurality of counter stages according to the determined storage states and a set of rules. The set of rules can include, for example, switching the storage states of certain counter stages according to the determined storage states of certain counter stages. At the end of the counting operation, the storage state(s) of the reception stage(s) except the dual-purpose counter stage(s) (designated reception stage(s)) can be in the second storage state, and the storage states of the cache stage(s) and the dual-purpose counter stage(s) (designated reception stage(s)) can represent the count result in binary format. For example, if binary 1 and binary 0 are used to represent fail bit and pass bit, respectively, stored in the reception stages, then at the end of the counting operation, the reception stage(s) except the dual-purpose counter stage(s) can all store binary 0. Further, each of the cache stage(s) and the dual-purpose counter stage(s) (designated reception stage (s)) can store either binary 1 or binary 0. The 1's and 0's in the cache stage(s) dual-purpose counter stage(s) together form a binary number indicating the number of fail bits in the verification bits received by the reception stages before the counting operation.

In some implementations, the one or more cache stages can include a first cache stage and a second cache stage coupled to each other. The plurality of reception stages can include N reception stages, i.e., a first reception stage, a second reception stage, . . . an N-th reception stage, coupled one after another in this order. The first reception stage of the N reception stages can be coupled to the second cache stage. Further, each of the reception group can include M reception stages. In this disclosure, M and N are integers. In some implementations, N can be an integer that is a power of 2 (such as 4, 8, 16, or 32), and M can be an integer that is also a power of 2 but smaller than or equal to N/2 (such as 2, 4, or 8). In some implementations, M and N satisfies: $2^{M+1}=N$. At the beginning of a counting operation, both the first and second cache stages can be in the second storage state and the storage state of each of the first to N-th reception stages can depend on whether the reception stage received fail bit or pass bit.

In some implementations, controlling the counter to count fail bits can includes determining whether the N reception stages are all in the first storage state. If the N reception stages are all in the first storage state, the first cache stage can be controlled to switch to the first storage state and the N reception stages be controlled to switch to the second storage state.

Further, if the N reception stages are not all in the first storage state, i.e., if at least one of the N reception stages is not in the first storage state, it can be further determined whether the first reception stage to the (N/2)-th reception stage are all in the first storage state and/or whether the (N/2+1)-th reception stage to an N-th reception stage are all in the first storage state. If the first reception stage to the (N/2)-th reception stage are all in the first storage state, then the second cache stage can be controlled to switch to the first storage state and the first reception stage to the (N/2)-th reception stage can be controlled to switch to the second storage state. Similarly, if the (N/2+1)-th reception stage to the N-th reception stage are all in the first storage state, then the second cache stage can be controlled to switch to the first storage state and the (N/2+1)-th reception stage to the N-th reception stage can be controlled to switch to the second storage state.

In some implementations, the counter includes N/2 reception groups and each of the reception groups includes two reception stages. In this scenario, controlling the counter to count fail bits can further include, for each reception group, determining whether one of the two reception stages is in the second storage state and another one of the two reception stages is in the first storage state. If so, the one of the two reception stages can be controlled to switch to the first storage state and the other one of the two reception stages can be controlled to switch to the second storage state, i.e., the storage states of the two reception stages are "swapped." For example, considering the second reception group, which would include the third reception stage and the fourth reception stage, it is determined whether the third reception stage is in the second storage state and the fourth reception stage is in the first storage state. If so, then the third reception stage is controlled to switch to the first storage state and the fourth reception stage is controlled to switch to the second storage state.

In some embodiments, controlling the counter to count fail bits can further include, for each reception group, determining whether both of the two reception stages are in the first storage state. If so, one of the two reception stages can be controlled to switch to the second storage state (while the storage state of the other one of the two reception stages can be maintained unchanged). Still take the second reception group as an example, if both the third reception stage and the fourth reception stage are in the first storage state, then the fourth reception stage can be controlled to switch to the second storage state.

In the following, further details of the fail bit count method will be described using an example in which the counter includes two cache stages and eight reception stages, i.e., the counter can count up to eight fail bits at a time.

In some implementations, controlling the counter to count fail bits can further include determining whether the first, third, fifth, and seventh reception stages are all in the first storage state and the second, fourth, sixth, and eighth reception stages are all in the second storage state. If so, then the second cache stage can be controlled to switch to the first storage state and the first, third, fifth, and seventh reception stages can be controlled to switch to the second storage state.

In some implementations, controlling the counter to count fail bits can further include determining whether the first and third reception stages are both in the first storage state, and the second and fourth reception stages are both in the second storage state. If so, then the first and third reception stages can be controlled to switch to the second storage state, and the second reception stage can be controlled to switch to the first storage state. Similarly, controlling the counter to count fail bits can further include determining whether the fifth and seventh reception stages are both in the first storage state, and the sixth and eighth reception stages are both in the second storage state. If so, then the fifth and seventh reception stages can be controlled to switch to the second storage state, and the sixth reception stage can be controlled to switch to the first storage state.

In some implementations, controlling the counter to count fail bits can further include determining whether the first reception stage is in the first storage state and the second reception stage is in the second storage state. If so, then the fourth reception stage can be controlled to switch to the second storage state and the second reception stage can be controlled to switch to the first storage state, i.e., the storage states of the second and the fourth reception stages can be "swapped." Similarly, controlling the counter to count fail bits can further include determining whether the eighth reception stage is in the first storage state and the sixth reception stage is in the second storage state. If so, then the eighth reception stage can be controlled to switch to the second storage state and the sixth reception stage can be controlled to switch to the first storage state, i.e., the storage states of the sixth and the eighth reception stages can be "swapped."

In some implementations, controlling the counter to count fail bits can further include determining whether the third reception stage is in the first storage state and the first reception stage is in the second storage state. If so, then the third reception stage can be controlled to switch to the second storage state and the first reception stage can be controlled to switch to the first storage state, i.e., the storage states of the first and the third reception stages can be "swapped." Similarly, controlling the counter to count fail bits can further include determining whether the seventh reception stage is in the first storage state and the fifth reception stage is in the second storage state. If so, then the seventh reception stage can be controlled to switch to the second storage state and the fifth reception stage can be controlled to switch to the first storage state, i.e., the storage states of the fifth and the seventh reception stages can be "swapped."

In some implementations, controlling the counter to count fail bits can further include determining whether the second and sixth reception stages are both in the first storage state. If so, then the second cache stage can be controlled to switch to the first storage state, and the second and the sixth reception stages can be controlled to switch to the second storage state.

In some implementations, controlling the counter to count fail bits can further include determining whether the first, second, and fifth reception stages are all in the first storage state and the third, fourth, sixth, seventh, and eighth reception stages are all in the second storage state. If so, then the second cache stage can be controlled to switch to the first storage state, and the first, second, and fifth reception stages can be controlled to switch to the second storage state.

In some implementations, controlling the counter to count fail bits can further include determining whether the second, fifth, and sixth reception stages are all in the first storage state and the first, third, fourth, seventh, and eighth reception stages are all in the second storage state. If so, then the second cache stage can be controlled to switch to the first storage state, and the second, fifth, and sixth reception stages can be controlled to switch to the second storage state.

In some implementations, controlling the counter to count fail bits can further include determining whether the first and fifth reception stages are both in the first storage state. If so, then the second cache stage can be controlled to switch to the first storage state, and the first and fifth reception stages can be controlled to switch to the second storage state.

In some implementations, controlling the counter to count fail bits can further include determining whether the second reception stage is in the second storage state and the sixth reception stage is in the first storage state. If so, then the second reception stage can be controlled to switch to the first storage state, and the sixth reception stage can be controlled to switch to the second storage state, i.e., the storage states of the second and sixth reception stages are "swapped."

In some implementations, controlling the counter to count fail bits can further include determining whether the first reception stage is in the second storage state and the fifth reception stage is in the first storage state. If so, then the first reception stage can be controlled to switch to the first storage state, and the fifth reception stage can be controlled to switch to the second storage state, i.e., the storage states of the first and fifth reception stages are "swapped."

As described above, the count result in binary format is stored in the cache stages and the dual-purpose counter stages. For example, the counter include a first cache stage, a second cache stage, and N reception stages, and the first reception stage to the P-th reception stage can be used as the dual-purpose counter stages, where P is an integer that satisfies $2^{P+1}=N$. More specifically, the first cache stage, the second cache stage, the P-th reception stage, the (P−1)-th reception stage, . . . , and the first reception stage store the binary-format count result in this order, i.e., the first cache stage stores the most significant bit and the first reception stage stores the least significant bit.

The above-described determination operations and corresponding storage state switching operations can be all performed, or some of them can be skipped if certain conditions are met. This will not affect the final count result. For example, if all of the reception stages were in the first storage state at the beginning of the counting operation, then all the reception stages will be switched to the second storage states in the first switching operation described above, and hence all other determination operations will give negative results and the corresponding storage state switching will not happen. Thus, even if the other determination operations and switching operations are performed, they will not have further impact on the storage states of the counter stages and hence will not further change the count result.

As described above, the cache stages and the dual-purpose counter stages (designated reception stages) can be used to store the final count result in binary format. In the case where the counter includes two cache stages and eight reception stages, the first and second reception stages can be used as the dual-purpose counter stages. At the end of counting operation, for example, the storage state of the first reception stage can represent the lowest digit of the binary-format count result, the storage state of the second reception stage can represent the next lowest digit of the binary-format count result, the storage state of the first cache stage can represent the highest digit of the binary-format count result, and the storage state of the second cache stage can represent the next highest digit of the binary-format count result. For example, if, at the end of the counting operation, the first cache stage, the second cache stage, the first reception stage, and the second reception stage are in the second storage state, the first storage state, the first storage state, and the second storage state, respectively, then such states represent a binary number 0101, i.e., five fail bits were originally received by the reception stages.

In the following, an example counting operation using a counter consistent with the disclosure will be described in more detail using the counter 700 shown in FIGS. 7A-7C as an example. In FIGS. 7A-7C, the first and second cache latches 732 are labeled as DS and DA, respectively, and the first to eighth reception latches 712 are labeled as D1 to D8, respectively. In the example described below, high and low voltage levels are used to represent binary 1 and binary 0, respectively, and the voltage level at the "D" node of each latch is used to indicate the data stored in the latch. For example, if the "D" node of a latch, such as node D_1 of latch D1, is at the high level (and hence correspondingly the "N" node of the latch, such as node N_1 of latch D1, is at the low level), then it means that the latch stores binary 1. In contrast, if the "D" node of a latch is at the low level (and hence correspondingly the "N" node of the latch is at the high level), then it means that the latch stores binary 0.

In the counter 700 shown in FIGS. 7A-7C, reading of data stored in various counter stages (specifically counter latches) and writing of data into various counter stages (specifically counter latches) can be realized by applying proper signals to various terminals of the counter stage. Take latch D1 for example, to determine if D1 stores binary 1, a high-voltage-level pulse can be applied to terminal Rd_1_1 (signal applied to terminal Rd_1_1 is also referred to as Rd_1_1 signal, same applies to other terminals) to turn on the transistor 716B. If D1 does store binary 1, then node N_1 (connected to the gate of the transistor 716A) is at low level and hence the transistor 716A is off, and thus turning on the transistor 716B will not affect the voltage level at the power supply line 702. As such, if the power supply line 702 is originally at high level, the power supply line 702 will remain at high level, which keeps the ground transistor 717 to be on and hence the sources of the first and second transistors 713 and 714 are grounded. In this circumstance, if a high-voltage-level pulse is applied to terminal Rst_1 or Set_1 (i.e., the gate of the first transistor 713 or the gate of the second transistor 714), D1 can be reset to store 0 or set to store 1. On the other hand, if D1 does not store binary 1, then node N_1 is at high level and hence the transistor 716A is on, and thus turning on the transistor 716B connects the power supply line 702 to the ground. As such, if the power supply line 702 is originally at high level, the power supply line 702 will be pulled down to low level. Thus, the ground transistor 717 is turned off and hence the sources of the first and second transistors 713 and 714 are not grounded, i.e., are floating. In this circumstance, a high-voltage-level pulse applied to terminal Rst_1 or Set_1 will not have impact on the data stored in D1.

Similarly, to determine if D1 stores binary 0, a high-voltage-level pulse can be applied to terminal Rd_1 to turn on the transistor 715B. If D1 does store binary 0, then node D_1 (connected to the gate of the transistor 715A) is at low level and hence the transistor 715A is off, and thus turning on the transistor 715B will not affect the voltage level at the power supply line 702. As such, if the power supply line 702 is originally at high level, the power supply line 702 will remain at high level, which keeps the ground transistor 717 to be on and hence the sources of the first and second transistors 713 and 714 are grounded. In this circumstance, if a high-voltage-level pulse is applied to terminal Rst_1 or Set_1, D1 can be reset to store 0 or set to store 1. On the other hand, if D1 does not store binary 0, then node D_1 is at high level and hence the transistor 715A is on, and thus turning on the transistor 715B connects the power supply line 702 to the ground. As such, if the power supply line 702 is originally at high level, the power supply line 702 will be pulled down to low level. Thus, the ground transistor 717 is turned off and hence the sources of the first and second transistors 713 and 714 are not grounded, i.e., are floating. In this circumstance, a high-voltage-level pulse applied to terminal Rst_1 or Set_1 will not have impact on the data stored in D1.

Further, the switches 720 can be turned on and off to electrically connect and separate different reception groups. When a switch 720 is turned off, the reception groups coupled together through the switch 720 can be subjected to stored data determination and data change operations independently. In the description below, the three switches are referred to as SW0, SW1, and SW2, respectively, which are configured to receive switch signals Sw_0, Sw_1, and Sw_2, respectively, to be turned on and off.

Using the properties described above, a determination of the storage state of a counter latch and an operation to change the storage state of the counter latch depending on the determination result to be true can be realized. This can be utilized to realize a counting operation consistent with the disclosure.

Figure 9:
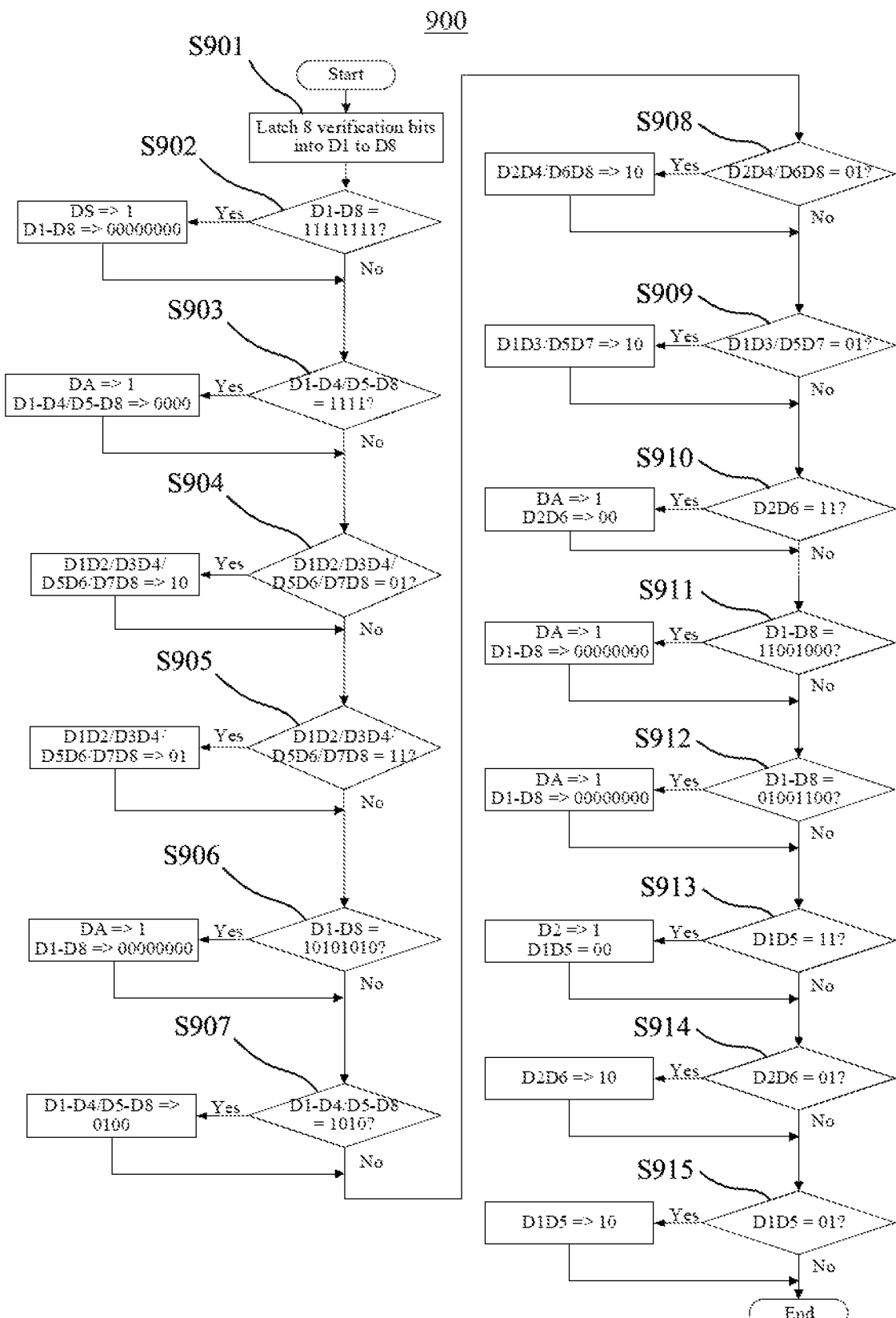
FIG. 9 is a flow chart showing an example counting operation applicable to the counter shown in FIGS. 7A-7C.
Figure 10A:
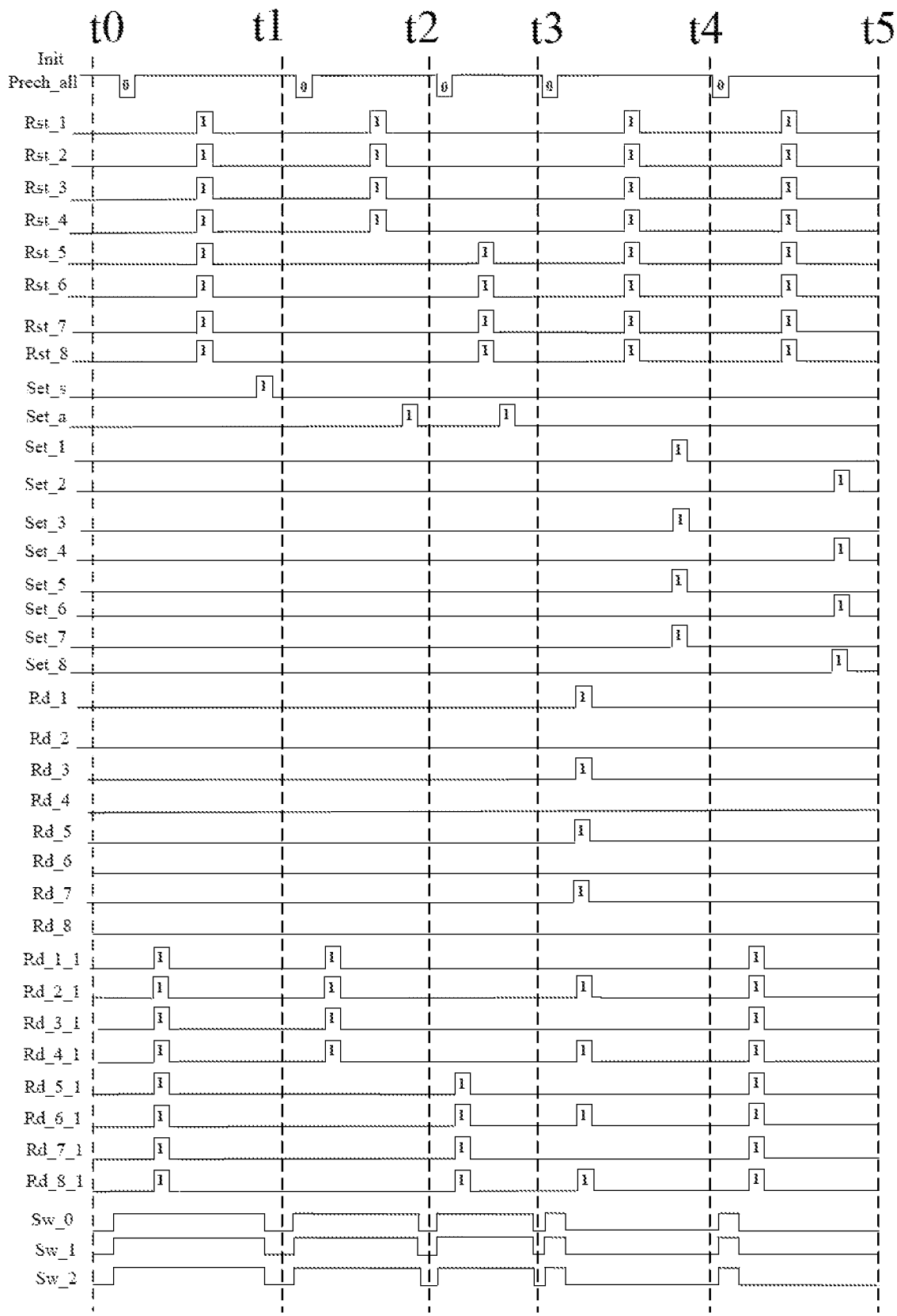
FIGS. 10A-10C are schematic example timing diagrams for the counter shown in FIGS. 7A-7C.
Figure 10B:
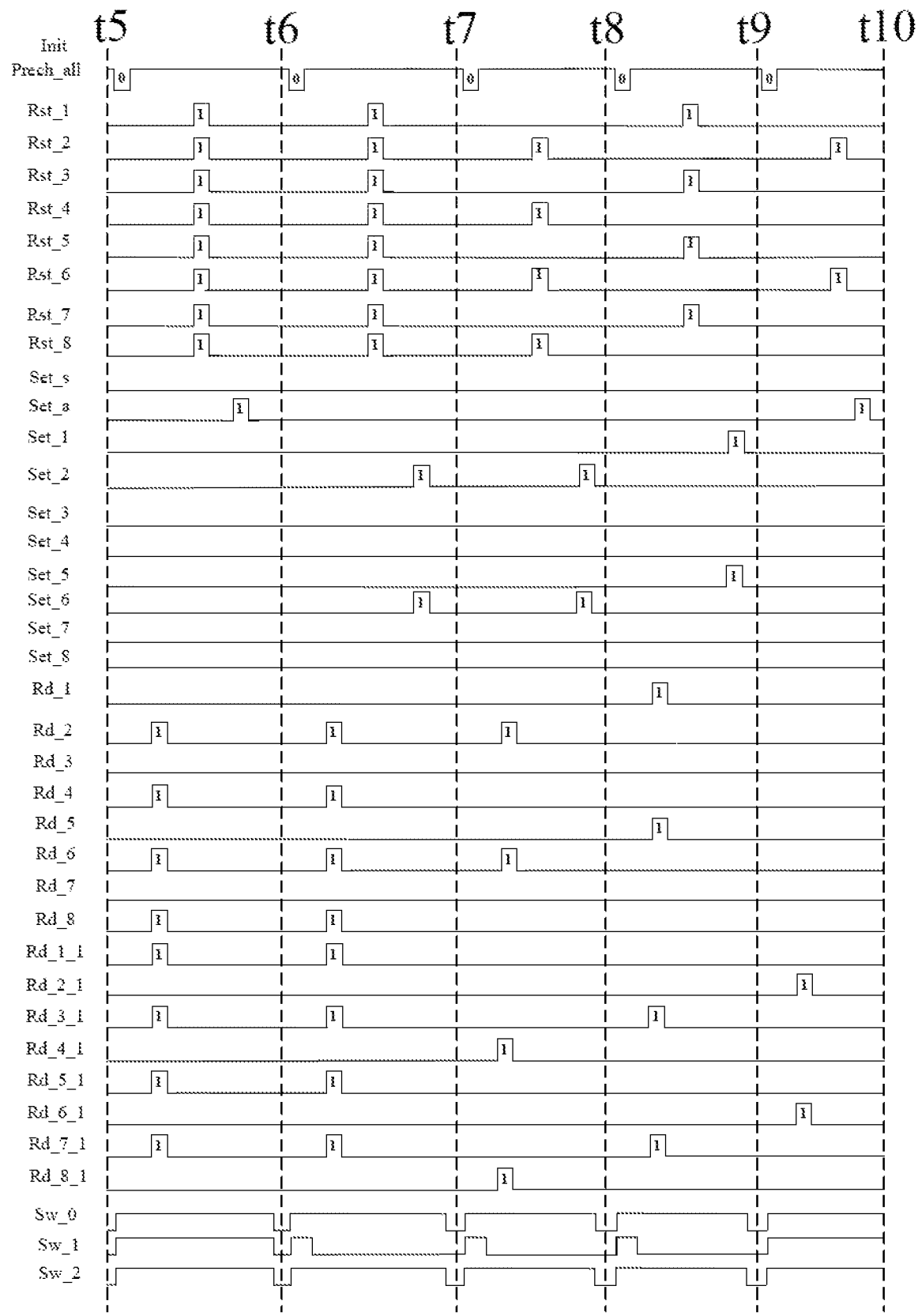
Figure 10C:
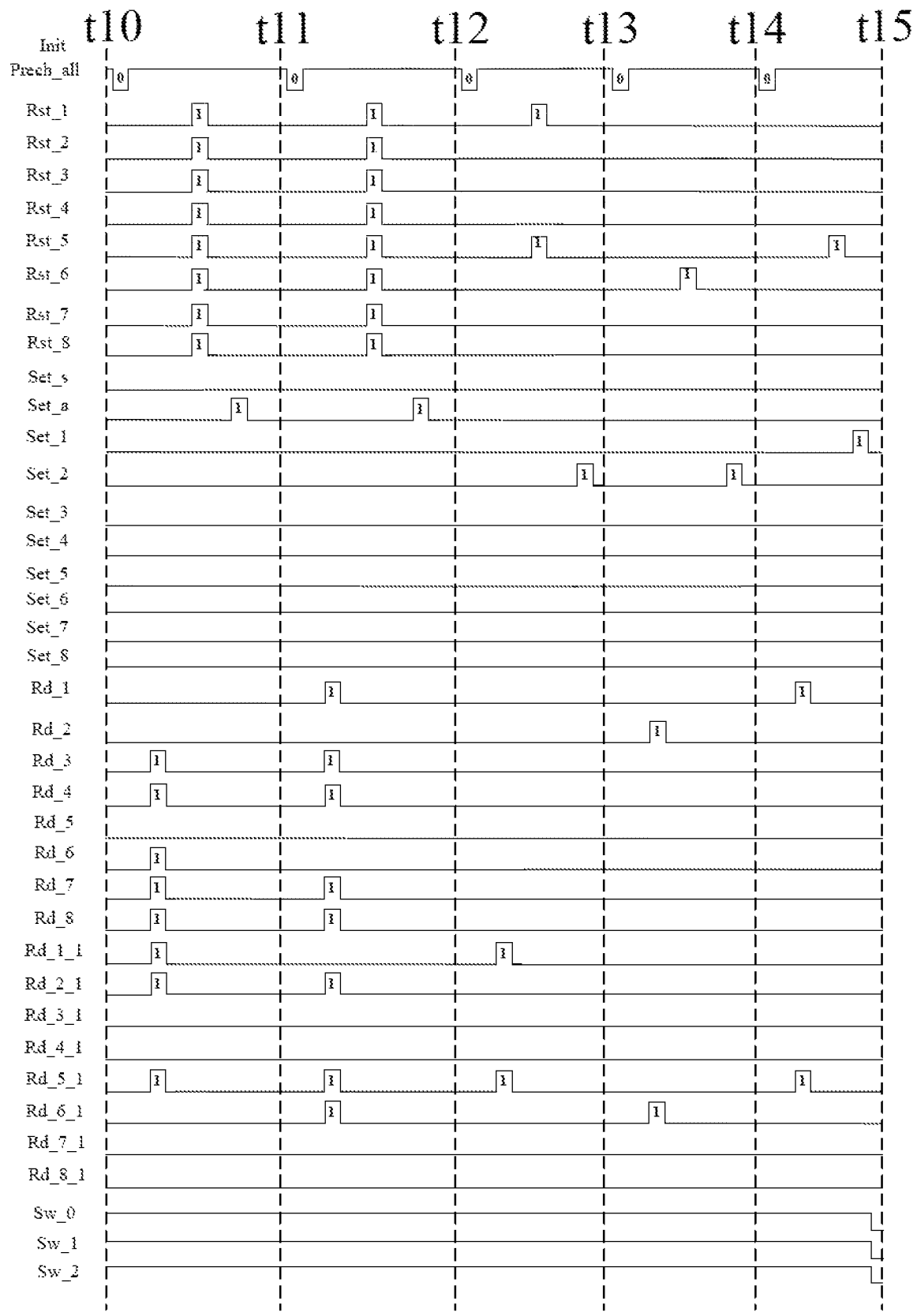

FIG. 9 is a flow chart showing an example counting operation 900 that can be applied to the counter 700 shown in FIGS. 7A-7C. FIGS. 10A-10C are schematic example timing diagrams for the counter 700, showing example changes of various signals for controlling the counting operation of the counter 700 that corresponds to the process shown in FIG. 9.

As shown in FIG. 9, at S901, eight verification bits are stored into latches D1 to D8. At S902, it is determined whether all of latches D1 to D8 store binary 1. If so, latch DS is set to store binary 1 and latches D1 to D8 are reset to store binary 0. The operations at S902 correspond to the time period between t0 and t1 (period P1) in the timing diagram shown in FIG. 10A.

Consistent with the disclosure, at the beginning of each period shown in FIGS. 10A-10C, a low-level pulse is applied to node Prech_all to turn on the power-supply transistor 704 for a short period of time, to charge the power supply line 702 to high level, and all switches SW0 to SW2 are also turned on by high-level switch signals at nodes Sw_0 to Sw_2, respectively. Thus, at the beginning of each period, the entire power supply line 702 is charged to high level. After the initial charging in a certain period, a switch can remain on or be turned off, depending on the operation to be performed during the period. A switch remaining on during a period is referred to as the switch being "turned on" in the period, and a switch being turned off after the initial charging is referred to as the switch being "turned off" in the period (albeit the switch is always turned on for at least a short period of time at the beginning of each period).

As shown in FIG. 10A, in period P1, all three switches SW0 to SW2 are turned on. A high-level pulse is applied to each of nodes Rd_1_1 to Rd_8_1. Then a high-level pulse is applied to each of nodes Rst_1 to Rst_8, and a high-level pulse is applied to node Set_s. If all of latches D1 to D8 store binary 1, then the corresponding N nodes N_1 to N_8 are all at low level. In this scenario, although the pulses applied to the nodes Rd_1_1 to Rd_8_1 can turn on the transistors 716B in all reception stages, the transistors 716A in all reception stages remain off, and hence the power supply line 702 remain at high level, turning on the ground transistors 717 in all the reception stages and the ground transistor 737 in the first cache stage. As such, the pulses applied to nodes Rst_1 to Rst_8 can reset all of latches D1 to D8 to store binary 0, and the pulse applied to node Set_s can set latch dS to store binary 1. In contrast, if any of latches D1 to D8 stores binary 0, then the corresponding N node is at high level to turn on the corresponding transistor 716A. In this scenario, turning on the corresponding transistor 716B by the pulse applied thereto will make the entire transistor string conducting, pulling down the power supply line 702 to low level. The ground transistors 717 in all the reception stages and the ground transistor 737 in the first cache stage are turned off, making the first transistors 713 in all the reception stages and the second transistor 734 in the first cache stage float. As such, the pulses applied to nodes Rst_1 to Rst_8 and the pulse applied to node Set_s will not change the storage states of corresponding latches. That is, the pulses are ineffective. This operation can realize the processes of determining whether latches D1-D8 all store binary 1, and if so, changing storage states of DS and D1-D8.

The functions of various signals and the corresponding results in period P1 are described in detail above. For other periods in the timing diagrams, the functions and results can be determined according to the process flow in FIG. 9 and the timing diagrams in FIGS. 10A-10C, and hence detailed descriptions thereof are omitted.

Refer to FIG. 9 again, at S903, it is determined whether all of latches D1 to D4 store binary 1, or all of latches D5 to D8 store binary 1. If all of latches D1 to D4 store binary 1, latch DA is set to store binary 1 and latches D1 to D4 are reset to store binary 0. Similarly, if all of latches D5 to D8 store binary 1, latch DA is set to store binary 1 and latches D5 to D8 are reset to store binary 0. The operations at S903 correspond to the time period between t1 and t2 (period P2) and the time period between t2 and t3 (period P3) in the timing diagram shown in FIG. 10A, in which all switches SW0 to SW2 are turned on.

Refer to FIG. 9 again, at S904, it is determined whether latch D1 stores binary 0 and latch D2 stores binary 1, or whether latch D3 stores binary 0 and latch D4 stores binary 1, or whether latch D5 stores binary 0 and latch D6 stores binary 1, or whether latch D7 stores binary 0 and latch D8 stores binary 1. If any of the conditions is determined to be true, then the corresponding latches swap their storage states. For example, if latch D1 stores binary 0 and latch D2 stores binary 1, then latch D1 is set to store binary 1 and latch D2 is reset to store binary 0. The operations at S904 correspond to the time period between t3 and t4 (period P4) in the timing diagram shown in FIG. 10A, in which all switches SW0 to SW2 are turned off. As shown in FIGS. 7A-7C, latches D1 and D2 are in the first reception group, latches D3 and D4 are in the second reception group, latches D5 and D6 are in the third reception group, and latches D7 and D8 are in the four reception group. The four reception groups are coupled through switches SW0 to SW2. Since switches SW0 to SW2 are turned off, the four reception groups are separated from each other and can be operated independently. Thus, pulses applied to one group will not affect the other groups, and hence certain pulses can be applied simultaneously to different groups.

Refer to FIG. 9 again, at S905, it is determined whether both latches D1 and D2 store binary 1, or whether both latches D3 and D4 store binary 1, or whether both latches D5 and D6 store binary 1, or whether both latches D7 and D8 store binary 1. If any of the conditions is determined to be true, then one of the latches in the group (the earlier one specifically) is controlled to change storage state. For example, if both latches D1 and D2 store binary 1, then latch D1 is reset to store binary 0. The operations at S905 correspond to the time period between t4 and t5 (period P5) in the timing diagram shown in FIG. 10A, in which all switches SW0 to SW2 are turned off.

Refer to FIG. 9 again, at S906, it is determined whether latches D1, D3, D5, and D7 all store binary 1, and latches D2, D4, D6, and D8 all store binary 0. If so, latch DA is set to store binary 1, and latches D1, D3, D5, and D7 are reset to store binary 0. The operations at S906 correspond to the time period between t5 and t6 (period P6) in the timing diagram shown in FIG. 10B, in which all switches SW0 to SW2 are turned on.

Refer to FIG. 9 again, at S907, it is determined whether latches D1 and D3 both store binary 1 and latches D2 and D4 both store binary 0, or whether latches D5 and D7 both store binary 1 and latches D6 and D8 both store binary 0. If the former condition is met, latch D2 is set to store binary 1 and latches D1 and D3 are reset to store binary 0. Similarly, if the latter condition is met, latch D6 is set to store binary 1 and latches D5 and D7 are reset to store binary 0. The operations at S907 correspond to the time period between t6 and t7 (period P7) in the timing diagram shown in FIG. 10B, in which switches SW0 and SW2 are turned on and switch SW1 is turned off.

Refer to FIG. 9 again, at S908, it is determined whether latch D2 stores binary 0 and latch D4 stores binary 1, or whether latch D6 stores binary 0 and latch D8 stores binary 1. If either of the conditions is determined to be true, then the corresponding latches swap their storage states. For example, if latch D2 stores binary 0 and latch D4 stores binary 1, then latch D2 is set to store binary 1 and latch D4 is reset to store binary 0. The operations at S908 correspond to the time period between t7 and t8 (period P8) in the timing diagram shown in FIG. 10B, in which switches SW0 and SW2 are turned on and switch SW1 is turned off.

Refer to FIG. 9 again, at S909, it is determined whether latch D1 stores binary 0 and latch D3 stores binary 1, or whether latch D5 stores binary 0 and latch D7 stores binary 1. If either of the conditions is determined to be true, then the corresponding latches swap their storage states. For example, if latch D1 stores binary 0 and latch D3 stores binary 1, then latch D1 is set to store binary 1 and latch D3 is reset to store binary 0. The operations at S909 correspond to the time period between t8 and t9 (period P9) in the timing diagram shown in FIG. 10B, in which switches SW0 and SW2 are turned on and switch SW1 is turned off.

Refer to FIG. 9 again, at S910, it is determined whether latches D2 and D6 both store binary 1. If so, latch DA is set to store binary 1, and latches D2 and D6 are reset to store binary 0. The operations at S910 correspond to the time period between t9 and t10 (period P10) in the timing diagram shown in FIG. 10B, in which all switches SW0 to SW2 are turned on.

Refer to FIG. 9 again, at S911, it is determined whether latches D1, D2, and D5 all store binary 1, and latches D3, D4, D6, D7, and D8 all store binary 0. If so, latch DA is set to store binary 1, and latches D1, D2, and D5 are reset to store binary 0. The operations at S911 correspond to the time period between t10 and t11 (period P11) in the timing diagram shown in FIG. 10C, in which all switches SW0 to SW2 are turned on.

Refer to FIG. 9 again, at S912, it is determined whether latches D2, D5, and D6 all store binary 1, and latches D1, D3, D4, D7, and D8 all store binary 0. If so, latch DA is set to store binary 1, and latches D2, D5, and D6 are reset to store binary 0. The operations at S912 correspond to the time period between t11 and t12 (period P12) in the timing diagram shown in FIG. 10C, in which all switches SW0 to SW2 are turned on.

Refer to FIG. 9 again, at S913, it is determined whether latches D1 and D5 both store binary 1. If so, latch D2 is set to store binary 1, and latches D1 and D5 are reset to store binary 0. The operations at S913 correspond to the time period between t12 and t13 (period P13) in the timing diagram shown in FIG. 10C, in which all switches SW0 to SW2 are turned on.

Refer to FIG. 9 again, at S914, it is determined whether latch D2 stores binary 0 and latch D6 stores binary 1. If so, latch D2 is set to store binary 1, and latch D6 is reset to store binary 0. The operations at S914 correspond to the time period between t13 and t14 (period P14) in the timing diagram shown in FIG. 10C, in which all switches SW0 to SW2 are turned on.

Refer to FIG. 9 again, at S915, it is determined whether latch D1 stores binary 0 and latch D5 stores binary 1. If so, latch D1 is set to store binary 1, and latch D5 is reset to store binary 0. The operations at S915 correspond to the time period between t14 and t15 (period P15) in the timing diagram shown in FIG. 10C, in which all switches SW0 to SW2 are turned on.

Some examples are described below with tables to show the changes of the values stored in the counter latches DS, DA, and D1 to D8 while the counting operation progresses. In the tables, the latches are denoted using their letters or numbers (e.g., latch DS is denoted as "S" and latch D1 is denoted as "1"), and letter "x" indicates the value stored in a corresponding latch can be either value. Table 1 shows one example, in which the eight verification bits initially stored in the eight reception latches D1 to D8 are 01101101, i.e., the reception latches initially latch five fail bits. As shown in Table 1, at the end of the counting operation, the count result stored in the cache latch DS, cache latch DA, dual-purpose latch D2, and dual-purpose latch D1 is 0101, i.e., five in binary format.

TABLE 1

| | Operations | S | A | 1 | 2 | 3 | 4 | 5 | 6 | 7 | 8 |
|---|---|---|---|---|---|---|---|---|---|---|---|
| S901 | Load verification bits | 0 | 0 | 0 | 1 | 1 | 0 | 1 | 1 | 0 | 1 |
| S902 | Turn on SW0-SW2<br>If 12345678 = 11111111, then SA12345678 => 1000000000 | 0 | 0 | 0 | 1 | 1 | 0 | 1 | 1 | 0 | 1 |
| S903 | Turn on SW0-SW2<br>If 12345678 = 1111xxxx, then SA12345678 = x10000xxxx, or<br>if 12345678 = xxxx1111, then SA12345678 = x1xxxx0000 | 0 | 0 | 0 | 1 | 1 | 0 | 1 | 1 | 0 | 1 |
| S904 | Turn off SW0-SW2<br>If 12345678 = 01xxxxxx or xx01xxxx or xxxx01xx or xxxxxx01,<br>then SA12345678 = xx10xxxxxx or xxxx10xxxx or xxxxxx10xx or xxxxxxxx10 | 0 | 0 | 1 | 0 | 1 | 0 | 1 | 1 | 1 | 0 |
| S905 | Turn off SW0-SW2<br>If 12345678 = 11xxxxxx or xx11xxxx or xxxx11xx or xxxxxx11,<br>then SA12345678 = xx01xxxxxx or xxxx01xxxx or xxxxxx01xx or xxxxxxxx01 | 0 | 0 | 1 | 0 | 1 | 0 | 0 | 1 | 1 | 0 |
| S906 | Turn on SW0-SW2<br>If 12345678 = 10101010, then SA12345678 = x100000000 | 0 | 0 | 1 | 0 | 1 | 0 | 0 | 1 | 1 | 0 |
| S907 | Turn on SW0 and SW2 and turn off SW1<br>If 12345678 = 1010xxxx or xxxx1010,<br>then SA12345678 = xx0100xxxx or xxxxxx0100 | 0 | 0 | 0 | 1 | 0 | 0 | 0 | 1 | 1 | 0 |
| S908 | Turn on SW0 and SW2 and turn off SW1<br>If 12345678 = x0x1xxxx or xxxxx0x1,<br>then SA12345678 = xxx1x0xxxx or xxxxxxx1x0 | 0 | 0 | 0 | 1 | 0 | 0 | 0 | 1 | 1 | 0 |
| S909 | Turn on SW0 and SW2 and turn off SW1<br>If 12345678 = 0x1xxxxx or xxxx0x1x,<br>then SA12345678 = xx1x0xxxxx or xxxxxx1x0x | 0 | 0 | 0 | 1 | 0 | 0 | 1 | 1 | 0 | 0 |
| S910 | Turn on SW0-SW2<br>If 12345678 = x1xxx1xx, then SA12345678 = x1x0xxx0xx | 0 | 1 | 0 | 0 | 0 | 0 | 1 | 0 | 0 | 0 |
| S911 | Turn on SW0-SW2<br>If 12345678 = 11001000, then SA12345678 = x100000000 | 0 | 1 | 0 | 0 | 0 | 0 | 1 | 0 | 0 | 0 |
| S912 | Turn on SW0-SW2<br>If 12345678 = 01001100, then SA12345678 = x100000000 | 0 | 1 | 0 | 0 | 0 | 0 | 1 | 0 | 0 | 0 |
| S913 | Turn on SW0-SW2<br>If 12345678 = 1xxx1xxx, then SA12345678 = xx01xx0xxx | 0 | 1 | 0 | 0 | 0 | 0 | 1 | 0 | 0 | 0 |
| S914 | Turn on SW0-SW2<br>If 12345678 = x0xxx1xx, then SA12345678 = xxx1xxx0xx | 0 | 1 | 0 | 0 | 0 | 0 | 1 | 0 | 0 | 0 |
| S915 | Turn on SW0-SW2<br>If 12345678 = 0xxx1xxx, then SA12345678 = xx1xxx0xxx<br>Final count result: SA21 = 0101 | 0 | 1 | 1 | 0 | 0 | 0 | 0 | 0 | 0 | 0 |

Table 2 shows another example, in which the eight verification bits initially stored in the eight reception latches D1 to D8 are 10101010, i.e., the reception latches initially latch four fail bits. As shown in Table 2, at the end of the counting operation, the count result stored in the cache latch DS, cache latch DA, dual-purpose latch D2, and dual-purpose latch D1 is 0100, i.e., four in binary format.

TABLE 2

| | Operations | S | A | 1 | 2 | 3 | 4 | 5 | 6 | 7 | 8 |
|---|---|---|---|---|---|---|---|---|---|---|---|
| S901 | Load verification bits | 0 | 0 | 1 | 0 | 1 | 0 | 1 | 0 | 1 | 0 |
| S902 | Turn on SW0-SW2<br>If 12345678 = 11111111, then SA12345678 => 1000000000 | 0 | 0 | 1 | 0 | 1 | 0 | 1 | 0 | 1 | 0 |
| S903 | Turn on SW0-SW2<br>If 12345678 = 1111xxxx, SA12345678 = x10000xxxx, or<br>if 12345678 = xxxx1111, then SA12345678 = x1xxxx0000 | 0 | 0 | 1 | 0 | 1 | 0 | 1 | 0 | 1 | 0 |
| S904 | Turn off SW0-SW2<br>If 12345678 = 01xxxxxx or xx01xxxx or xxxx01xx or xxxxxx01,<br>then SA12345678 = xx10xxxxxx or xxxx10xxxx or xxxxxx10xx or xxxxxxxx10 | 0 | 0 | 1 | 0 | 1 | 0 | 1 | 0 | 1 | 0 |
| S905 | Turn off SW0-SW2<br>If 12345678 = 11xxxxxx or xx11xxxx or xxxx11xx or xxxxxx11,<br>then SA12345678 = xx01xxxxxx or xxxx01xxxx or xxxxxx01xx or xxxxxxxx01 | 0 | 0 | 1 | 0 | 1 | 0 | 1 | 0 | 1 | 0 |
| S906 | Turn on SW0-SW2<br>If 12345678 = 10101010, then SA12345678 = x100000000 | 0 | 1 | 0 | 0 | 0 | 0 | 0 | 0 | 0 | 0 |
| S907 | Turn on SW0 and SW2 and turn off SW1<br>If 12345678 = 1010xxxx or xxxx1010,<br>then SA12345678 = xx0100xxxx or xxxxxx0100 | 0 | 1 | 0 | 0 | 0 | 0 | 0 | 0 | 0 | 0 |
| S908 | Turn on SW0 and SW2 and turn off SW1<br>If 12345678 = x0x1xxxx or xxxxx0x1,<br>then SA12345678 = xxx1x0xxxx or xxxxxxx1x0 | 0 | 1 | 0 | 0 | 0 | 0 | 0 | 0 | 0 | 0 |
| S909 | Turn on SW0 and SW2 and turn off SW1<br>If 12345678 = 0x1xxxxx or xxxx0x1x,<br>then SA12345678 = xx1x0xxxxx or xxxxxx1x0x | 0 | 1 | 0 | 0 | 0 | 0 | 0 | 0 | 0 | 0 |
| S910 | Turn on SW0-SW2<br>If 12345678 = x1xxx1xx, then SA12345678 = x1x0xxx0xx | 0 | 1 | 0 | 0 | 0 | 0 | 0 | 0 | 0 | 0 |
| S911 | Turn on SW0-SW2<br>If 12345678 = 11001000, then SA12345678 = x100000000 | 0 | 1 | 0 | 0 | 0 | 0 | 0 | 0 | 0 | 0 |
| S912 | Turn on SW0-SW2<br>If 12345678 = 01001100, then SA12345678 = x100000000 | 0 | 1 | 0 | 0 | 0 | 0 | 0 | 0 | 0 | 0 |
| S913 | Turn on SW0-SW2<br>If 12345678 = 1xxx1xxx, then SA12345678 = xx01xx0xxx | 0 | 1 | 0 | 0 | 0 | 0 | 0 | 0 | 0 | 0 |
| S914 | Turn on SW0-SW2<br>If 12345678 = x0xxx1xx, then SA12345678 = xxx1xxx0xx | 0 | 1 | 0 | 0 | 0 | 0 | 0 | 0 | 0 | 0 |
| S915 | Turn on SW0-SW2<br>If 12345678 = 0xxx1xxx, then SA12345678 = xx1xxx0xxx<br>Final count result: SA21 = 0100 | 0 | 1 | 0 | 0 | 0 | 0 | 0 | 0 | 0 | 0 |

Table 3 shows another example, in which the eight verification bits initially stored in the eight reception latches D1 to D8 are 11111111, i.e., the reception latches initially latch eight fail bits. As shown in Table 3, at the end of the counting operation, the count result stored in the cache latch DS, cache latch DA, dual-purpose latch D2, and dual-purpose latch D1 is

TABLE 3

| | Operations | S | A | 1 | 2 | 3 | 4 | 5 | 6 | 7 | 8 |
|---|---|---|---|---|---|---|---|---|---|---|---|
| S901 | Load verification bits | 0 | 0 | 1 | 1 | 1 | 1 | 1 | 1 | 1 | 1 |
| S902 | Turn on SW0-SW2<br>If 12345678 = 11111111, then SA12345678 => 1000000000 | 1 | 0 | 0 | 0 | 0 | 0 | 0 | 0 | 0 | 0 |
| S903 | Turn on SW0-SW2<br>If 12345678 = 1111xxxx, SA12345678 = x10000xxxx, or<br>if 12345678 = xxxx1111, then SA12345678 = x1xxxx0000 | 1 | 0 | 0 | 0 | 0 | 0 | 0 | 0 | 0 | 0 |
| S904 | Turn off SW0-SW2<br>If 12345678 = 01xxxxxx or xx01xxxx or xxxx01xx or xxxxxx01,<br>then SA12345678 = xx10xxxxxx or xxxx10xxxx or xxxxxx10xx or xxxxxxxx10 | 1 | 0 | 0 | 0 | 0 | 0 | 0 | 0 | 0 | 0 |
| S905 | Turn off SW0-SW2<br>If 12345678 = 11xxxxxx or xx11xxxx or xxxx11xx or xxxxxx11,<br>then SA12345678 = xx01xxxxxx or xxxx01xxxx or xxxxxx01xx or xxxxxxxx01 | 1 | 0 | 0 | 0 | 0 | 0 | 0 | 0 | 0 | 0 |
| S906 | Turn on SW0-SW2<br>If 12345678 = 10101010, then SA12345678 = x100000000 | 1 | 0 | 0 | 0 | 0 | 0 | 0 | 0 | 0 | 0 |

TABLE 3-continued

| Operations | S | A | 1 | 2 | 3 | 4 | 5 | 6 | 7 | 8 |
|---|---|---|---|---|---|---|---|---|---|---|
| S907 Turn on SW0 and SW2 and turn off SW1<br>If 12345678 = 1010xxxx or xxxx1010,<br>then SA12345678 = xx0100xxxx or xxxxxx0100 | 1 | 0 | 0 | 0 | 0 | 0 | 0 | 0 | 0 | 0 |
| S908 Turn on SW0 and SW2 and turn off SW1<br>If 12345678 = x0x1xxxx or xxxxx0x1,<br>then SA12345678 = xxx1x0xxxx or xxxxxxx1x0 | 1 | 0 | 0 | 0 | 0 | 0 | 0 | 0 | 0 | 0 |
| S909 Turn on SW0 and SW2 and turn off SW1<br>If 12345678 = 0x1xxxxx or xxxx0x1x,<br>then SA12345678 = xx1x0xxxxx or xxxxxx1x0x | 1 | 0 | 0 | 0 | 0 | 0 | 0 | 0 | 0 | 0 |
| S910 Turn on SW0-SW2<br>If 12345678 = x1xxx1xx, then SA12345678 = x1x0xxx0xx | 1 | 0 | 0 | 0 | 0 | 0 | 0 | 0 | 0 | 0 |
| S911 Turn on SW0-SW2<br>If 12345678 = 11001000, then SA12345678 = x100000000 | 1 | 0 | 0 | 0 | 0 | 0 | 0 | 0 | 0 | 0 |
| S912 Turn on SW0-SW2<br>If 12345678 = 01001100, then SA12345678 = x100000000 | 1 | 0 | 0 | 0 | 0 | 0 | 0 | 0 | 0 | 0 |
| S913 Turn on SW0-SW2<br>If 12345678 = 1xxx1xxx, then SA12345678 = xx01xx0xxx | 1 | 0 | 0 | 0 | 0 | 0 | 0 | 0 | 0 | 0 |
| S914 Turn on SW0-SW2<br>If 12345678 = x0xxx1xx, then SA12345678 = xxx1xxx0xx | 1 | 0 | 0 | 0 | 0 | 0 | 0 | 0 | 0 | 0 |
| S915 Turn on SW0-SW2<br>If 12345678 = 0xxx1xxx, then SA12345678 = xx1xxx0xxx<br>Final count result: SA21 = 1000 | 1 | 0 | 0 | 0 | 0 | 0 | 0 | 0 | 0 | 0 |

Table 4 shows another example, in which the eight verification bits initially stored in the eight reception latches D1 to D8 are 11001000, i.e., the reception latches initially latch three fail bits. As shown in Table 4, at the end of the counting operation, the count result stored in the cache latch DS, cache latch DA, dual-purpose latch D2, and dual-purpose latch D1 is 0011, i.e., three in binary format.

TABLE 4

| Operations | S | A | 1 | 2 | 3 | 4 | 5 | 6 | 7 | 8 |
|---|---|---|---|---|---|---|---|---|---|---|
| S901 Load verification bits | 0 | 0 | 1 | 1 | 0 | 0 | 1 | 0 | 0 | 0 |
| S902 Turn on SW0-SW2<br>If 12345678 = 11111111, then SA12345678 => 1000000000 | 0 | 0 | 1 | 1 | 0 | 0 | 1 | 0 | 0 | 0 |
| S903 Turn on SW0-SW2<br>If 12345678 = 1111xxxx, then SA12345678 = x10000xxxx, or<br>if 12345678 = xxxx1111, then SA12345678 = x1xxxx0000 | 0 | 0 | 1 | 1 | 0 | 0 | 1 | 0 | 0 | 0 |
| S904 Turn off SW0-SW2<br>If 12345678 = 01xxxxxx or xx01xxxx or xxxx01xx or xxxxxx01,<br>then SA12345678 = xx10xxxxxx or xxxx10xxxx or xxxxxx10xx or xxxxxxxx10 | 0 | 0 | 1 | 1 | 0 | 0 | 1 | 0 | 0 | 0 |
| S905 Turn off SW0-SW2<br>If 12345678 = 11xxxxxx or xx11xxxx or xxxx11xx or xxxxxx11,<br>then SA12345678 = xx01xxxxxx or xxxx01xxxx or xxxxxx01xx or xxxxxxxx01 | 0 | 0 | 0 | 1 | 0 | 0 | 1 | 0 | 0 | 0 |
| S906 Turn on SW0-SW2<br>If 12345678 = 10101010, then SA12345678 = x100000000 | 0 | 0 | 0 | 1 | 0 | 0 | 1 | 0 | 0 | 0 |
| S907 Turn on SW0 and SW2 and turn off SW1<br>If 12345678 = 1010xxxx or xxxx1010,<br>then SA12345678 = xx0100xxxx or xxxxxx0100 | 0 | 0 | 0 | 1 | 0 | 0 | 1 | 0 | 0 | 0 |
| S908 Turn on SW0 and SW2 and turn off SW1<br>If 12345678 = x0x1xxxx or xxxxx0x1,<br>then SA12345678 = xxx1x0xxxx or xxxxxxx1x0 | 0 | 0 | 0 | 1 | 0 | 0 | 1 | 0 | 0 | 0 |
| S909 Turn on SW0 and SW2 and turn off SW1<br>If 12345678 = 0x1xxxxx or xxxx0x1x,<br>then SA12345678 = xx1x0xxxxx or xxxxxx1x0x | 0 | 0 | 0 | 1 | 0 | 0 | 1 | 0 | 0 | 0 |
| S910 Turn on SW0-SW2<br>If 12345678 = x1xxx1xx, then SA12345678 = x1x0xxx0xx | 0 | 0 | 0 | 1 | 0 | 0 | 1 | 0 | 0 | 0 |
| S911 Turn on SW0-SW2<br>If 12345678 = 11001000, then SA12345678 = x100000000 | 0 | 0 | 0 | 1 | 0 | 0 | 1 | 0 | 0 | 0 |
| S912 Turn on SW0-SW2<br>If 12345678 = 01001100, then SA12345678 = x100000000 | 0 | 0 | 0 | 1 | 0 | 0 | 1 | 0 | 0 | 0 |
| S913 Turn on SW0-SW2<br>If 12345678 = 1xxx1xxx, then SA12345678 = xx01xx0xxx | 0 | 0 | 0 | 1 | 0 | 0 | 1 | 0 | 0 | 0 |
| S914 Turn on SW0-SW2<br>If 12345678 = x0xxx1xx, then SA12345678 = xxx1xxx0xx | 0 | 0 | 0 | 1 | 0 | 0 | 1 | 0 | 0 | 0 |
| S915 Turn on SW0-SW2<br>If 12345678 = 0xxx1xxx, then SA12345678 = xx1xxx0xxx<br>Final count result: SA21 = 0011 | 0 | 0 | 1 | 1 | 0 | 0 | 0 | 0 | 0 | 0 |

Table 5 shows another example, in which the eight verification bits initially stored in the eight reception latches D1 to D8 are 01001100, i.e., the reception latches initially latch three fail bits. As shown in Table 5, at the end of the counting operation, the count result stored in the cache latch DS, cache latch DA, dual-purpose latch D2, and dual-purpose latch D1 is 0011, i.e., three in binary format.

TABLE 5

| | Operations | S | A | 1 | 2 | 3 | 4 | 5 | 6 | 7 | 8 |
|---|---|---|---|---|---|---|---|---|---|---|---|
| S901 | Load verification bits | 0 | 0 | 0 | 1 | 0 | 0 | 1 | 1 | 0 | 0 |
| S902 | Turn on SW0-SW2<br>If 12345678 = 11111111, then SA12345678 => 1000000000 | 0 | 0 | 0 | 1 | 0 | 0 | 1 | 1 | 0 | 0 |
| S903 | Turn on SW0-SW2<br>If 12345678 = 1111xxxx, SA12345678 = x10000xxxx, or<br>if 12345678 = xxxx1111, then SA12345678 = x1xxxx0000 | 0 | 0 | 0 | 1 | 0 | 0 | 1 | 1 | 0 | 0 |
| S904 | Turn off SW0-SW2<br>If 12345678 = 01xxxxxx or xx01xxxx or xxxx01xx or xxxxxx01,<br>then SA12345678 = xx10xxxxxx or xxxx10xxxx or xxxxxx10xx or xxxxxxxx10 | 0 | 0 | 1 | 0 | 0 | 0 | 1 | 1 | 0 | 0 |
| S905 | Turn off SW0-SW2<br>If 12345678 = 11xxxxxx or xx11xxxx or xxxx11xx or xxxxxx11,<br>then SA12345678 = xx01xxxxxx or xxxx01xxxx or xxxxxx01xx or xxxxxxxx01 | 0 | 0 | 1 | 0 | 0 | 0 | 0 | 1 | 0 | 0 |
| S906 | Turn on SW0-SW2<br>If 12345678 = 10101010, then SA12345678 = x100000000 | 0 | 0 | 1 | 0 | 0 | 0 | 0 | 1 | 0 | 0 |
| S907 | Turn on SW0 and SW2 and turn off SW1<br>If 12345678 = 1010xxxx or xxxx1010,<br>then SA12345678 = xx0100xxxx or xxxxxx0100 | 0 | 0 | 1 | 0 | 0 | 0 | 0 | 1 | 0 | 0 |
| S908 | Turn on SW0 and SW2 and turn off SW1<br>If 12345678 = x0x1xxxx or xxxxx0x1,<br>then SA12345678 = xxx1x0xxxx or xxxxxxx1x0 | 0 | 0 | 1 | 0 | 0 | 0 | 0 | 1 | 0 | 0 |
| S909 | Turn on SW0 and SW2 and turn off SW1<br>If 12345678 = 0x1xxxxx or xxxx0x1x,<br>then SA12345678 = xx1x0xxxxx or xxxxxx1x0x | 0 | 0 | 1 | 0 | 0 | 0 | 0 | 1 | 0 | 0 |
| S910 | Turn on SW0-SW2<br>If 12345678 = x1xxx1xx, then SA12345678 = x1x0xxx0xx | 0 | 0 | 1 | 0 | 0 | 0 | 0 | 1 | 0 | 0 |
| S911 | Turn on SW0-SW2<br>If 12345678 = 11001000, then SA12345678 = x100000000 | 0 | 0 | 1 | 0 | 0 | 0 | 0 | 1 | 0 | 0 |
| S912 | Turn on SW0-SW2<br>If 12345678 = 01001100, then SA12345678 = x100000000 | 0 | 0 | 1 | 0 | 0 | 0 | 0 | 1 | 0 | 0 |
| S913 | Turn on SW0-SW2<br>If 12345678 = 1xxx1xxx, then SA12345678 = xx01xx0xxx | 0 | 0 | 1 | 0 | 0 | 0 | 0 | 1 | 0 | 0 |
| S914 | Turn on SW0-SW2<br>If 12345678 = x0xxx1xx, then SA12345678 = xxx1xxx0xx | 0 | 0 | 1 | 1 | 0 | 0 | 0 | 0 | 0 | 0 |
| S915 | Turn on SW0-SW2<br>If 12345678 = 0xxx1xxx, then SA12345678 = xx1xxx0xxx<br>Final count result: SA21 = 0011 | 0 | 0 | 1 | 1 | 0 | 0 | 0 | 0 | 0 | 0 |

Table 6 shows another example, in which the eight verification bits initially stored in the eight reception latches D1 to D8 are 01010101, i.e., the reception latches initially latch four fail bits. As shown in Table 6, at the end of the counting operation, the count result stored in the cache latch DS, cache latch DA, dual-purpose latch D2, and dual-purpose latch D1 is 0100, i.e., four in binary format.

TABLE 6

| | Operations | S | A | 1 | 2 | 3 | 4 | 5 | 6 | 7 | 8 |
|---|---|---|---|---|---|---|---|---|---|---|---|
| S901 | Load verification bits | 0 | 0 | 0 | 1 | 0 | 1 | 0 | 1 | 0 | 1 |
| S902 | Turn on SW0-SW2<br>If 12345678 = 11111111, then SA12345678 => 1000000000 | 0 | 0 | 0 | 1 | 0 | 1 | 0 | 1 | 0 | 1 |
| S903 | Turn on SW0-SW2<br>If 12345678 = 1111xxxx, SA12345678 = x10000xxxx, or<br>if 12345678 = xxxx1111, then SA12345678 = x1xxxx0000 | 0 | 0 | 0 | 1 | 0 | 1 | 0 | 1 | 0 | 1 |
| S904 | Turn off SW0-SW2<br>If 12345678 = 01xxxxxx or xx01xxxx or xxxx01xx or xxxxxx01,<br>then SA12345678 = xx10xxxxxx or xxxx10xxxx or xxxxxx10xx or xxxxxxxx10 | 0 | 0 | 1 | 0 | 1 | 0 | 1 | 0 | 1 | 0 |
| S905 | Turn off SW0-SW2<br>If 12345678 = 11xxxxxx or xx11xxxx or xxxx11xx or xxxxxx11,<br>then SA12345678 = xx01xxxxxx or xxxx01xxxx or xxxxxx01xx or xxxxxxxx01 | 0 | 0 | 1 | 0 | 1 | 0 | 1 | 0 | 1 | 0 |
| S906 | Turn on SW0-SW2<br>If 12345678 = 10101010, then SA12345678 = x100000000 | 0 | 1 | 0 | 0 | 0 | 0 | 0 | 0 | 0 | 0 |

TABLE 6-continued

| Operations | S | A | 1 | 2 | 3 | 4 | 5 | 6 | 7 | 8 |
|---|---|---|---|---|---|---|---|---|---|---|
| S907 Turn on SW0 and SW2 and turn off SW1<br>If 12345678 = 1010xxxx or xxxx1010,<br>then SA12345678 = xx0100xxxx or xxxxxx0100 | 0 | 1 | 0 | 0 | 0 | 0 | 0 | 0 | 0 | 0 |
| S908 Turn on SW0 and SW2 and turn off SW1<br>If 12345678 = x0x1xxxx or xxxxx0x1,<br>then SA12345678 = xxx1x0xxxx or xxxxxxx1x0 | 1 | 0 | 0 | 0 | 0 | 0 | 0 | 0 | 0 | 0 |
| S909 Turn on SW0 and SW2 and turn off SW1<br>If 12345678 = 0x1xxxxx or xxxx0x1x,<br>then SA12345678 = xx1x0xxxxx or xxxxxx1x0x | 0 | 1 | 0 | 0 | 0 | 0 | 0 | 0 | 0 | 0 |
| S910 Turn on SW0-SW2<br>If 12345678 = x1xxx1xx, then SA12345678 = x1x0xxx0xx | 0 | 1 | 0 | 0 | 0 | 0 | 0 | 0 | 0 | 0 |
| S911 Turn on SW0-SW2<br>If 12345678 = 11001000, then SA12345678 = x100000000 | 0 | 1 | 0 | 0 | 0 | 0 | 0 | 0 | 0 | 0 |
| S912 Turn on SW0-SW2<br>If 12345678 = 01001100, then SA12345678 = x100000000 | 0 | 1 | 0 | 0 | 0 | 0 | 0 | 0 | 0 | 0 |
| S913 Turn on SW0-SW2<br>If 12345678 = 1xxx1xxx, then SA12345678 = xx01xx0xxx | 0 | 1 | 0 | 0 | 0 | 0 | 0 | 0 | 0 | 0 |
| S914 Turn on SW0-SW2<br>If 12345678 = x0xxx1xx, then SA12345678 = xxx1xxx0xx | 0 | 1 | 0 | 0 | 0 | 0 | 0 | 0 | 0 | 0 |
| S915 Turn on SW0-SW2<br>If 12345678 = 0xxx1xxx, then SA12345678 = xx1xxx0xxx<br>Final count result: SA21 = 0100 | 0 | 1 | 0 | 0 | 0 | 0 | 0 | 0 | 0 | 0 |

The digital VFC circuit consistent with the disclosure can accurately count the fail bits without undercounting and/or overcounting. Thus, the yield of the memory device can be improved.

Figure 11:
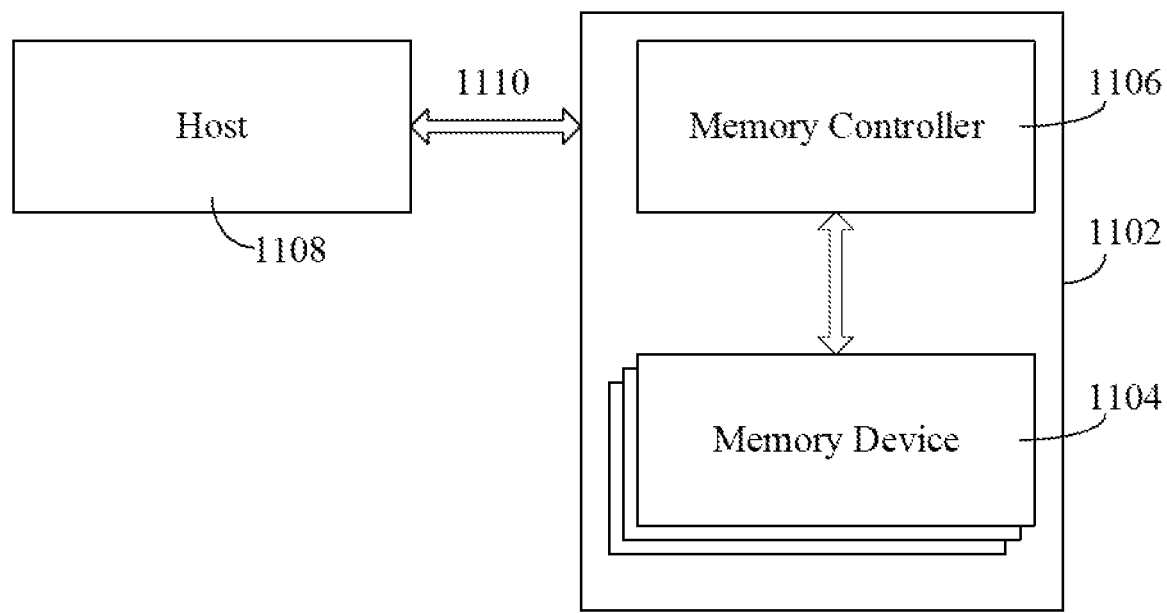
FIG. 11 is a block diagram of an example system according to some aspects of the present disclosure.

FIG. 11 is a block diagram of an example system 1100 having a memory device according to some aspects of the present disclosure. The system 1100 can be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic device having storage therein. As shown in FIG. 11, the system 1100 includes a memory system 1102 having one or more memory devices 1104 and a memory controller 1106. The system 1100 further includes a host 1108. The host 1108 can be a processor of an electronic device, such as a central processing unit (CPU), or a system-on-chip (SoC), such as an application processor (AP). The host 1108 can be configured to send or receive data to or from the one or more memory devices 1104. Each of the one or more memory devices 1104 can include a memory device according to some aspects of the present disclosure, such as one of the example memory devices described above.

The memory controller 1106 is coupled to the one or more memory devices 1104 and the host 1108, and is configured to control operation of the one or more memory devices 1104, according to some implementations. The memory controller 1106 can also be integrated into the one or more memory devices 1104. The memory controller 1106 can manage the data stored in the one or more memory devices 1104 and communicate with the host 1108 via an interface 1110. In some implementations, the memory controller 1106 is designed for operating in a low duty-cycle environment, such as a secure digital (SD) card, a compact Flash (CF) card, a universal serial bus (USB) Flash drive, or another medium for use in electronic devices, such as personal computers, digital cameras, mobile phones, etc. In some other implementations, the memory controller 1106 is designed for operating in a high duty-cycle environment, such as a solid-state drive (SSD) or an embedded multi-media-card (eMMC) used as data storage for mobile devices, such as smartphones, tablets, laptop computers, etc., and enterprise storage arrays. The memory controller 1106 can be configured to control operations of the one or more memory devices 1104, such as read, erase, and program operations.

Figure 12:
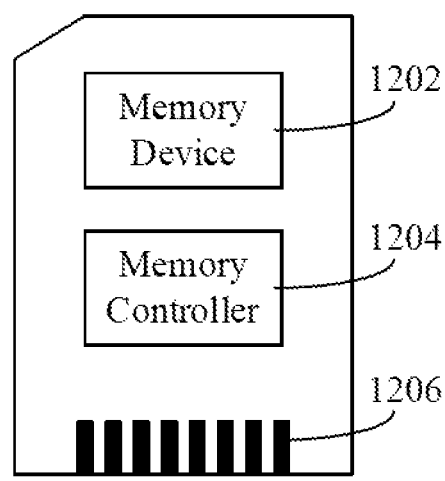
FIG. 12 is a block diagram of an example memory card according to some aspects of the present disclosure.
Figure 13:
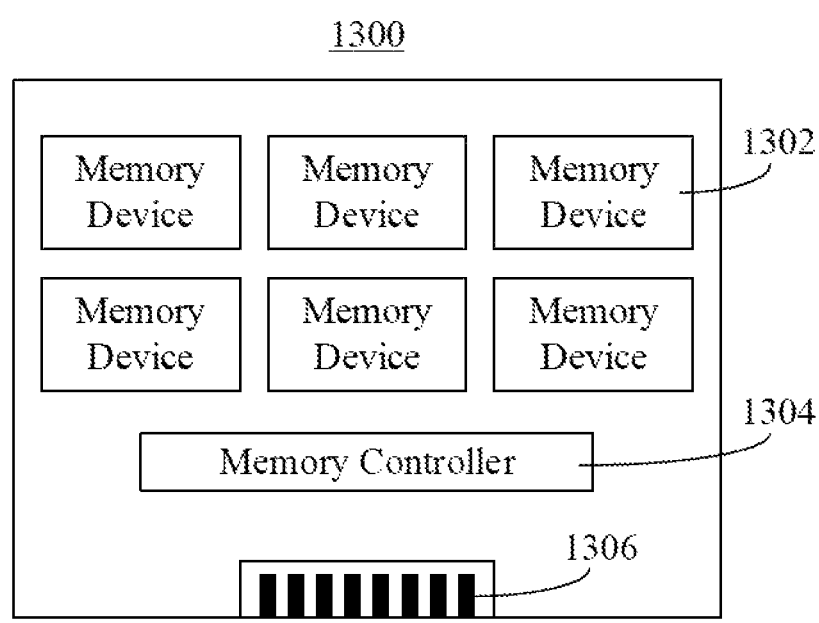
FIG. 13 is a block diagram of an example solid-state drive according to some aspects of the present disclosure.

The memory controller 1106 and the one or more memory devices 1104 can be integrated into various types of storage devices, for example, be included in the same package, such as a universal Flash storage (UFS) package or an eMMC package. That is, the memory system 1102 can be implemented and packaged into different types of end electronic products. FIGS. 12 and 13 are block diagrams of an example memory card 1200 and an example SSD 1300, respectively, according to some aspects of the present disclosure. As shown in FIG. 12, a single memory device 1202 and a memory controller 1204 are integrated into the memory card 1200. The memory device 1202 can include a memory device according to some aspects of the present disclosure, such as one of the above-described example memory devices. The memory card 1200 can include a PC card (personal computer memory card international association (PCMCIA)), a CF card, a smart media (SM) card, a memory stick, a multimedia card (MMC, RS-MMC, or MMCmicro), an SD card (SD, miniSD, microSD, or SDHC), a UFS, etc. As shown in FIG. 12, the memory card 1200 further includes a memory card interface or interface connector 1206 configured to couple the memory card 1200 to a host (e.g., the host 1108 shown in FIG. 11).

As shown in FIG. 13, multiple memory devices 1302 and a memory controller 1304 are integrated into the SSD 1300. Each of the memory devices 1302 can include a memory device according to some aspects of the present disclosure, such as one of the above-described example memory devices. As shown in FIG. 13, the SSD 1300 further includes an SSD interface or interface connector 1306 configured to couple the SSD 1300 to a host (e.g., the host 2008 shown in FIG. 20).

Figure 14:
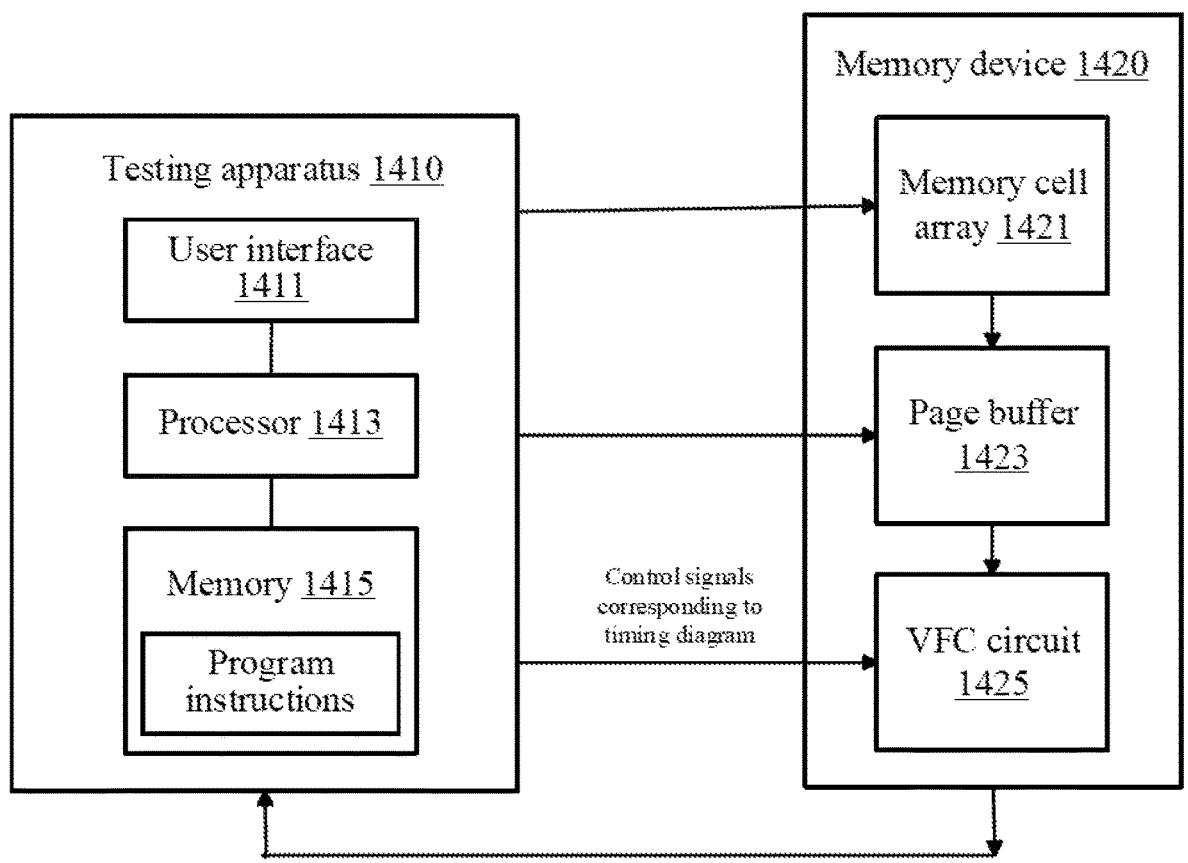
FIG. 14 is a schematic diagram showing a testing set-up including an example VFC circuit according to some aspects of the present disclosure.

FIG. 14 is a schematic diagram showing a testing set-up including an example VFC circuit according to some aspects of the present disclosure. As shown in FIG. 14, a testing apparatus 1410 (which can include, for example, the host 2008 in FIG. 20) is connected to a memory device 1420. The testing apparatus 1410 includes a user interface 1411, a processor 1413, and a memory 1415 storing program instructions. A user can interact with the testing apparatus 1410 through the user interface 1411. The memory device 1420 includes a memory cell array 1421, a buffer circuit 1423, and a VFC circuit 1425.

In some implementations, the processor 1413 executes the program instruction stored in the memory 1415 to perform an operation according to some aspects of the present disclosure. For example, the processor 1413 can control to generate control signals to control the VFC circuit 1425 to accurately count the fail bits in the memory cell array.

In some implementations, the user interface 1411 can be a liquid crystal display (LCD) or an organic light-emitting diode (OLED) display having a touch-control function. The user interface 1411 can also include a keyboard, a mouse, a USB interface, and a communication interface. A user can use the keyboard, the mouse, and the USB interface to set up the verification operation of the memory device 1420. The processor 1413 can be a central processing unit (CPU). The processor 1413 can also include a hardware chip. The hardware chip can be, e.g., an application-specific integrated circuit (ASIC), a programmable logic device (PLD), or a combination thereof. For example, the PLD can be a complex programmable logic device (CPLD), a field-programmable gate array (FPGA), or a combination thereof. The memory 1415 can include a volatile memory and/or a non-volatile memory.

According to some aspects of the present disclosure, the digital VFC circuit accurately counts the fail bits without undercounting and/or overcounting. Thus, the yield of the memory device can be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the scope of the present disclosure.

What is claimed is:

1. A verify failbit count (VFC) circuit comprising:
a counter configured to count fail bits among a plurality of verification bits generated by a verification operation of a memory device to obtain a count result in binary format;
wherein the counter includes:
a plurality of counter stages coupled one after another, the plurality of counter stages including:
one or more cache stages in a cache group; and
a plurality of reception stages divided into a plurality of reception groups each including one or more reception stages of the plurality of reception stages, and each of the reception stages being configured to receive a different one of the plurality of verification bits; and
one or more switches each coupled between two neighboring ones of the plurality of reception groups.

2. The VFC circuit of claim 1, wherein each of the plurality of counter stages includes a counter latch.

3. The VFC circuit of claim 2, wherein each of the plurality of counter stages further includes:
a first transistor coupled between a first terminal of the counter latch and a ground; and
a second transistor coupled between a second terminal of the counter latch and the ground.

4. The VFC circuit of claim 3, wherein each of the plurality of counter stages further includes:
a ground transistor coupled between:
the ground, and
each of the first transistor and the second transistor.

5. The VFC circuit of claim 2, wherein each of the one or more cache stages further includes a transistor string coupled between the counter latch of the cache stage and a power supply line, the transistor string including a plurality of transistors coupled in series.

6. The VFC circuit of claim 5, wherein a gate of one of the plurality of transistors is coupled to a terminal of the counter latch of the cache stage.

7. The VFC circuit of claim 2, wherein:
each of the plurality of reception stages further includes:
a first transistor string coupled between a first terminal of the counter latch of the reception stage and a power supply line; and
a second transistor string coupled between a second terminal of the counter latch of the reception stage and the power supply line; and
each of the first transistor string and the second transistor string includes a plurality of transistors coupled in series.

8. The VFC circuit of claim 1, wherein the plurality of reception groups include:
a first reception group directly coupled to the cache group without via any of the one or more switches; and
one or more second reception groups each coupled to the cache group via at least one of the one or more switches.

9. The VFC circuit of claim 8, wherein:
each of the plurality of counter stages includes a counter latch;
the counter latch in each of the plurality of reception stages is configured to latch one of the plurality of verification bits;
the counter latch in each of the one or more reception stages in the first reception group is further configured to store a part of the count result; and
the counter latch in each of the one or more cache stages is configured to store another part of the count result.

10. The VFC circuit of claim 8, wherein:
the one or more switches are coupled in a power supply line of the VFC circuit, the power supply line being coupled to a power supply; and
the one or more switches are configured to control power supply to the one or more second reception groups.

11. The VFC circuit of claim 1,
wherein the counter is one of a plurality of counters;
the VFC circuit further comprising:
an adder configured to sum up the count results from two or more of the plurality of counters.

12. The VFC circuit of claim 1,
wherein the VFC circuit includes a plurality of VFC sub-circuits, and the counter belongs to one of the plurality of VFC sub-circuits;
the VFC circuit further comprising:
an accumulator coupled to the plurality of VFC sub-circuits and configured to accumulate final binary sums output from the plurality of VFC sub-circuits.

13. A failbit counting method comprising:
controlling a counter of a verify failbit count (VFC) circuit of a memory device to receive a plurality of verification bits generated by a verification operation of the memory device; and controlling the counter to count fail bits among the plurality of verification bits to obtain a count result in binary format;
wherein the counter includes:
a plurality of counter stages coupled one after another, the plurality of counter stages including:
one or more cache stages in a cache group; and
a plurality of reception stages divided into a plurality of reception groups each including one or more reception stages of the plurality of reception stages, and each of the reception stages being configured to receive a different one of the plurality of verification bits; and
one or more switches each coupled between two neighboring ones of the plurality of reception groups.

14. A memory device comprising:
a memory cell array including a plurality of memory cells; and
the verify failbit count (VFC) circuit of claim 1 and coupled to the memory cell array.

15. A verify failbit count (VFC) circuit comprising:
a counter configured to count fail bits among a plurality of verification bits generated by a verification operation of a memory device to obtain a count result in binary format;
wherein the counter includes:
a plurality of counter stages coupled one after another, the plurality of counter stages including:
two cache stages in a cache group; and
N reception stages divided into a plurality of reception groups each including M reception stages of the N reception stages, each of the reception stages being configured to receive one of the plurality of verification bits, N being an integer that is a power of 2, and M being an integer that is a power of 2 and smaller than or equal to N/2; and
one or more switches each coupled between two neighboring ones of the plurality of reception groups.

16. The method of claim 13, wherein:
each of the plurality of counter stages has a first storage state and a second storage state, and the first storage state and the second storage state of a reception stage are used to represent that the reception stage stores a fail bit and a pass bit, respectively, after the verification bits are received by the counter; and
controlling the counter to count fail bits to obtain the count result in binary format includes:
determining storage states of the plurality of counter stages; and
controlling the storage states of the plurality of counter stages according to the determined storage states and a set of rules until the storage state of each of one or more reception stages except one or more designated reception stages is in the second storage state, the storage states of the one or more cache stages and the one or more designated reception stages representing the count result in binary format.

17. The method of claim 16, wherein:
the one or more cache stages include a first cache stage and a second cache stage coupled to each other;
the plurality of reception stages include N reception stages coupled to each other, a first reception stage of the N reception stages being coupled to the second cache stage, and N being an integer that is a power of 2;
each of the reception groups includes M reception stages, M being an integer that is a power of 2 and smaller than or equal to N/2; and
controlling the counter to count fail bits to obtain the count result in binary format includes:
determining whether the N reception stages are all in the first storage state; and
in response to the N reception stages being all in the first storage state:
controlling the first cache stage to switch to the first storage state; and
controlling the N reception stages to switch to the second storage state.

18. The method of claim 17, wherein controlling the counter to count fail bits to obtain the count result in binary format further includes at least one of, in response to the N reception stages not being all in the first storage state:
determining whether the first reception stage to an (N/2)-th reception stage are all in the first storage state, and in response to the first reception stage to the (N/2)-th reception stage being all in the first storage state:
controlling the second cache stage to switch to the first storage state; and
controlling the first reception stage to the (N/2)-th reception stage to switch to the second storage state; or
determining whether an (N/2+1)-th reception stage to an N-th reception stage are all in the first storage state, and in response to the (N/2+1)-th reception stage to the N-th reception stage being all in the first storage state:
controlling the second cache stage to switch to the first storage state; and
controlling the (N/2+1)-th reception stage to the N-th reception stage to switch to the second storage state.

19. The method of claim 18, wherein:
each of the plurality of reception groups includes two reception stages; and
controlling the counter to count fail bits to obtain the count result in binary format further includes, for each reception group:
determining whether one of the two reception stages is in the second storage state and another one of the two reception stages is in the first storage state; and
in response to the one of the two reception stages being in the second storage state and the other one of the two reception stages being in the first storage state, controlling the one of the two reception stages to switch to the first storage state and controlling the other one of the two reception stages to switch to the second storage state.

20. The method of claim 19, wherein controlling the counter to count fail bits to obtain the count result in binary format further includes, for each reception group:
determining whether both of the two reception stages are in the first storage state; and
in response to both of the two reception stages being in the first storage state, controlling one of the two reception stages to switch to the second storage state.

* * * * *